United States Patent

Nakamura et al.

[11] Patent Number: 5,847,458
[45] Date of Patent: Dec. 8, 1998

[54] SEMICONDUCTOR PACKAGE AND DEVICE HAVING HEADS COUPLED WITH INSULATING MATERIAL

[75] Inventors: Yasuharu Nakamura; Akiyoshi Nakamura, both of Nagano, Japan

[73] Assignee: Shinko Electric Industries Co., Ltd., Nagano, Japan

[21] Appl. No.: 858,846

[22] Filed: May 19, 1997

[30] Foreign Application Priority Data

May 21, 1996 [JP] Japan ................................. 8-150260
May 27, 1996 [JP] Japan ................................. 8-156216

[51] Int. Cl.⁶ ........................... H01L 23/00; H01L 23/28; H01L 23/48
[52] U.S. Cl. .......................... 257/738; 257/737; 257/734; 257/778; 257/692; 257/773; 257/787; 257/784
[58] Field of Search ..................... 257/738, 737, 257/734, 666, 787, 676, 668, 692, 778, 672, 686, 783, 786, 773, 784; 438/123, 118; 174/52.2; 29/827

[56] References Cited

U.S. PATENT DOCUMENTS

| | | | |
|---|---|---|---|
| 4,697,943 | 10/1987 | Ookubo | 400/568 |
| 5,463,593 | 10/1995 | Mostafazadeh et al. | 257/666 |
| 5,471,088 | 11/1995 | Song | 257/668 |
| 5,497,032 | 3/1996 | Tsuji et al. | 257/710 |
| 5,656,550 | 8/1997 | Tsuji et al. | 257/786 |

FOREIGN PATENT DOCUMENTS

| | | |
|---|---|---|
| 0424530 | 1/1990 | European Pat. Off. |
| 61-20770 | 6/1986 | Japan. |

*Primary Examiner*—Tom Thomas
*Assistant Examiner*—Alexander Oscar Williams
*Attorney, Agent, or Firm*—Pennie & Edmonds LLP

[57] ABSTRACT

A semiconductor device package includes a plurality of leads and a stage, for mounting a semiconductor chip, arranged in juxtaposition at predetermined spatial intervals. A protruding terminal is formed at a predetermined portion on the lower surface of each of the leads. An insulating material is deposited in a continuous layer on the upper surfaces and the side surfaces of a plurality of the leads and on the side surfaces of the stage. A plurality of the leads and the stage are integrally coupled to each other through the insulating material and, therefore, the upper surfaces of the leads, the upper surface of the stage for bonding a semiconductor chip, and the terminals on the lower surfaces of the leads are exposed outside the insulating material. A semiconductor chip is bonded on the upper surface of the stage, the electrodes of the chip are electrically connected to the terminals on the upper surfaces of the leads, and the upper surface of the stage and the upper surfaces of the leads are deposited with a sealing insulating material thereby to seal the semiconductor chip in the sealing material.

25 Claims, 31 Drawing Sheets

SEMICONDUCTOR PACKAGE AND DEVICE HAVING HEADS COUPLED WITH INSULATING MATERIAL

BACKGROUND OF THE INVENTION

1. Field of the Invention

The present invention relates to a package for a semiconductor chip, a semiconductor device having therein a semiconductor chip formed using the same package, and a method of fabricating the semiconductor device package and the semiconductor device.

2. Description of the Related Art

A conventional semiconductor device of BGA (Ball Grid Array) type has a semiconductor chip incorporated therein. This semiconductor device has the lower surface thereof formed with a plurality of terminals for connecting electronic circuits in a grid array. Each terminal is formed with a substantially semispherical soldering bump.

With the semiconductor device of the BGA type, the terminals formed on the lower surface thereof can be connected by soldering to the terminals of the electronic circuits formed on the surface of a board for packaging a semiconductor device (hereinafter referred to simply as "the board") by use of the soldering bumps formed on the terminals. Thus the semiconductor device can be mounted on the particular board.

In fabricating the BGA type semiconductor device described above, however, it is necessary to form a plurality of through holes in a substrate for mounting a semiconductor chip, to form a plurality of conductive plating layers using the electroless plating method and the electrolytic plating method on the inner peripheral surfaces of the holes, and to electrically connect a circuit pattern formed on the upper surface of the substrate to the terminals formed on the lower surface of an insulating substrate through the conductive layers. This fabrication process requires considerable labor and time.

SUMMARY OF THE INVENTION

The present invention has been developed in view of the above-mentioned problems, and an object of the present invention is to provide a semiconductor device package which can be fabricated easily for forming a semiconductor device, the same semiconductor device fabricated easily with the same package, a method of fabricating the same semiconductor device package, and a method of fabricating the same semiconductor device, in place of the BGA semiconductor device.

A first embodiment of a semiconductor device package of this invention comprises: a plurality of leads and a stage, for mounting a semiconductor chip, arranged in juxtaposition at predetermined spatial intervals; a protruded terminal formed at a predetermined portion on the lower surface of each of said leads; and an insulating material deposited in a continuous layer on the upper surfaces and the side surfaces of a plurality of said leads and on the side surfaces of said stage; wherein a plurality of said leads and said stage are integrally coupled to each other through said insulating material, and the upper surfaces of said leads, the upper surface of said stage for bonding a semiconductor chip, and the terminals on the lower surfaces of said leads are exposed outside said insulating material.

A second embodiment of a semiconductor device package of this invention comprises: a plurality of leads arranged in juxtaposition at predetermined spatial intervals; a protruded terminal formed at a predetermined portion of the lower surface of each of said leads; and an insulating material deposited in a continuous layer on the upper surfaces and the side surfaces of said leads; wherein a plurality of said leads are integrally coupled to each other through said insulating material, and the terminals on the upper surfaces of said leads and the terminals on the lower surfaces of said leads are exposed outside said insulating material.

A third embodiment of a semiconductor device package of this invention comprises: a plurality of leads and a stage for mounting a semiconductor chip arranged in juxtaposition at predetermined spatial intervals; and an insulating material deposited in a continuous layer on the lower surfaces and the side surfaces of said leads and the side surface of said stage; wherein a plurality of said leads and said stage are integrally coupled to each other through said insulating material, and the terminals on the lower surfaces of said leads are exposed outside said insulating material.

A fourth embodiment of a semiconductor device package of this invention comprises: a plurality of leads arranged in juxtaposition at predetermined spatial intervals; and an insulating material deposited in a continuous layer on the lower surfaces and the side surfaces of said leads; wherein a plurality of said leads are integrally coupled to each other through said insulating material, and the terminals on the lower surfaces of said leads are exposed outside said insulating material.

A semiconductor chip may be bonded on the upper surface of the stage, the electrodes of said chip are electrically connected to the terminals on the upper surfaces of said leads, and the upper surface of said stage and the upper surfaces of said leads are deposited with a sealing insulating material thereby to seal said semiconductor chip in said sealing material.

Otherwise, a semiconductor chip may be arranged above said leads, the electrodes of said chip are electrically connected to the terminals on the upper surfaces of said leads, and the upper surfaces of said leads are deposited with a sealing insulating material thereby to seal said semiconductor chip in said sealing insulating material.

Thus, first and second semiconductor devices using the above-mentioned packages can be made.

In the above-mentioned the semiconductor device package, the terminal on the upper surface of each lead and the corresponding terminal on the lower surface of the lead are connected electrically to each other through the lead.

As a result, it is no longer necessary to form through holes in an insulating material corresponding to a substrate, to form a plurality of conductive layers using the electroless plating method and the electrolytic plating method on the inner peripheral surfaces of the through holes, on to electrically connect the terminals on the upper and lower surfaces of the leads through the conductive layers.

Also, it is possible to electrically insulate a plurality of the leads from each other and/or a plurality of the leads and the stage from each other by the insulating material interposed therebetween.

Further, the terminals on the upper surfaces of the leads exposed out of the insulating material or the terminals on the upper surfaces of the leads not covered with the insulating material can be electrically connected to the electrodes of a semiconductor chip. Alternatively, or in addition, a semiconductor chip can be bonded on the upper surface of the stage exposed out of the insulating material or on the upper surface of the stage not covered with the insulating material.

Furthermore, a semiconductor chip can be sealed in a sealing insulating material to thereby protect the semiconductor chip from dust or dirt and humidity.

In addition, the terminals on the lower surfaces of the leads are connected by soldering to the terminals of the electronic circuits formed on the board surface, and the semiconductor device can be mounted on the surface of the board.

In the process, with the above-mentioned semiconductor device formed with terminals protruded from the lower surfaces of the leads, the lower surface of the semiconductor device can be raised above the board surface by the length of the terminals taking advantage of the fact that the same terminals are in stand-off positions. In this way, the lower surface portions of the leads other than the terminals can be prevented from being electrically shorted to the electronic circuits formed on the board surface.

Also, with the above-mentioned semiconductor device having an insulating material covered continuously on the lower and side surfaces of a plurality of the leads and having the lead terminals exposed out of the insulating material, the lower surface portions of the leads other than the terminals are covered by the insulating material. The insulating material, therefore, can prevent the lower surface portions of the leads other than the lower surface terminals of the leads from being electrically shorted to the electronic circuits formed on the board surface.

With the above-mentioned semiconductor device packages, on the other hand, the terminals on the upper surfaces of the leads and/or the upper surface of the stage are preferably plated for bonding.

With the above-mentioned semiconductor device packages, the terminals on the upper surfaces of the leads plated for bonding can be easily and securely bonded with wires for electrically connecting the electrodes of a semiconductor chip to the leads or can be flip-chip bonded easily and securely with the electrodes of a semiconductor chip. Alternatively or additionally, a semiconductor chip can be easily and securely bonded on the upper surface of the stage plated for bonding.

The third or fourth semiconductor device package according to the invention is preferably configured in such a manner that the upper surfaces and the side surfaces of a plurality of leads and/or the side surfaces of the stage except for the terminals on the upper surfaces of the leads are continuously covered by a reinforcing insulating material, and therefore a plurality of the leads are coupled to each other integrally and/or the leads and the stage are coupled to each other preferably integrally through the reinforcing insulating material.

With this semiconductor device package, a plurality of the leads can be coupled to each other and/or the leads and the stage can be coupled to each other integrally and securely through the reinforcing insulating material as well as through the insulating material.

The third semiconductor device package according to the invention has preferably a structure in which the insulating material is continuously covered on the lower surface of the stage as well as on the side surfaces of the stage, and therefore the leads and the stage are integrally coupled to each other through the insulating material.

The above-mentioned semiconductor device preferably has such a structure that the terminals on the lower surfaces of the leads and/or the lower surface of the stage are formed with a soldering bump. With this semiconductor device, the terminals on the lower surfaces of the leads can be easily and securely connected by soldering to the terminals of the electronic circuits formed on the board surface by use of the soldering bumps formed on the terminals on the lower surfaces of the leads. Alternatively or additionally, the stage can be easily and securely connected by soldering to a metal stage coupling formed on the board surface by use of the soldering bump formed on the lower surface of the stage.

The second semiconductor device according to the invention preferably has a structure in which the reverse surface of the semiconductor is exposed outside the sealing insulating material and a heat spreader is deposited on the reverse surface of the chip.

With this semiconductor device, the heat generated by the semiconductor chip can be efficiently dissipated out of the semiconductor device through the heat spreader.

A method of fabricating the first semiconductor device package of this invention comprises the steps of:

etching a plurality of predetermined portions of the upper surface of a metal plate, forming a plurality of contour blind grooves with a predetermined pattern in the upper surface of said metal plate, and forming a plurality of lead-forming portions and a stage-forming portion juxtaposed and defined by said contour blind grooves on said metal plate;

depositing a continuous layer of an insulating material on the upper surfaces and the side surfaces of a plurality of said lead-forming portions, the side surfaces of said stage and the inner side surfaces of said contour blind grooves interposed therebetween, except for the terminals on the upper surfaces of said lead-forming portions and the upper surface of said stage-forming portion bonded with a semiconductor chip; and etching a plurality of predetermined portions of the lower surface of said metal plate, forming a plurality of contour grooves in the lower surface portions of said metal plate just under said contour blind grooves, respectively, separating a plurality of said lead-forming portions from each other and said lead-forming portions and stage-forming portions from each other by said contour grooves, forming a plurality of said leads and said stage in juxtaposition at predetermined spatial intervals, exposing said insulating material between said contour grooves, and forming a protruded terminal at a predetermined portion of the lower surface of each of said leads.

A method of fabricating the second semiconductor device package of this invention comprises the steps of:

etching a plurality of predetermined portions of the upper surface of a metal plate, forming a plurality of contour blind grooves with a predetermined pattern in the upper surface of said metal plate, and forming a plurality of lead-forming portions juxtaposed and defined by said contour blind groove on said metal plate;

depositing a continuous layer of an insulating material on the upper surfaces and the side surfaces of a plurality of said lead-forming portions and the inner side surfaces of said contour blind grooves interposed therebetween, except for the terminals on the upper surfaces of said lead-forming portions; and etching a plurality of predetermined portions of the lower surface of said metal plate, forming a plurality of contour grooves in the lower surface portions of the metal plate just under said contour blind grooves, respectively, separating a plurality of said lead-forming portions from each other by said contour grooves, forming a plurality of said leads in juxtaposition at predetermined spatial intervals, exposing said insulating material between said contour grooves, and forming a protruded terminal at a predetermined portion of the lower surface of each of said leads.

A method of fabricating the third semiconductor device package of this invention comprises the steps of:

etching a plurality of predetermined portions of the lower surface of a metal plate, forming a plurality of contour blind grooves with a predetermined pattern in the lower surface of said metal plate, and forming a plurality of lead-forming portions and a stage-forming portion juxtaposed and defined by said contour blind grooves on said metal plate;

depositing a continuous layer of an insulating material on the lower surfaces and the side surfaces of a plurality of said lead-forming portions, the side surfaces of said stage-forming portion and the inner side surfaces of said contour blind grooves interposed therebetween;

removing the insulating material portions just under the terminals on the lower surfaces of said lead-forming portions thereby to expose said terminals out of said insulating material; and etching a plurality of predetermined portions of the upper surface of said metal plate, forming a plurality of contour grooves in the upper surface portions of the metal plate just above said contour blind grooves, respectively, separating a plurality of said lead-forming portions from each other and said lead-forming portions and said stage-forming portion from each other by said contour grooves, forming a plurality of said leads and said stage in juxtaposition at predetermined spatial intervals, forming a plurality of said leads and stages at predetermined spatial intervals, and exposing said insulating material between said contour grooves.

A method of fabricating the fourth semiconductor device package of this invention comprises the steps of:

etching a plurality of predetermined portions of the lower surface of a metal plate, forming a plurality of contour blind grooves in the lower surface of said metal plate, and forming a plurality of lead-forming portions juxtaposed and defined by said contour blind grooves on said metal plate;

depositing a continuous layer of an insulating material on the lower surfaces and the side surfaces of a plurality of said lead-forming portions and the inner side surfaces of said contour blind grooves interposed therebetween; and removing said insulating material portions just under the terminals on the lower surfaces of said lead-forming portions, respectively, to thereby expose said terminals outside said insulating material; and etching a plurality of predetermined portions of the upper surface of said metal plate, forming a plurality of contour grooves in the upper surface portions of the metal plate just above said contour blind grooves, respectively, separating a plurality of said lead-forming portions from each other by said contour grooves, forming a plurality of said leads in juxtaposition at predetermined spatial intervals, and exposing said insulating material between said contour grooves.

In the above-mentioned method of fabricating a semiconductor device package or a semiconductor device, predetermined portions on the upper and lower surfaces of a metal plate are etched so that a plurality of the leads and/or the stage can be formed in juxtaposition at predetermined spatial intervals. At the same time, with the above-mentioned method of fabricating the first or second semiconductor device package, a protruded terminal can be formed at a predetermined portion on the lower surface of each lead.

Also, it is possible to couple a plurality of leads to each other and/or the leads and the stage to each other integrally through an insulating material, and to insulate electrically a plurality of the leads from each other and/or the leads and the stage from each other by the insulating material interposed therebetween.

Furthermore, the terminals on the upper surfaces of the leads can be electrically connected to the terminals on the lower surfaces of the leads through the leads. It is thus possible to eliminate the need of forming a plurality of through holes in the insulating material corresponding to the substrate, depositing a plurality of conductive Layers on the inner peripheral surfaces of the holes by the electroless plating method or by the electrolytic plating method, and then electrically connecting the terminals on the upper surfaces of the leads to the terminals on the lower surfaces of the leads through the conductive layers.

In addition, with the above-mentioned method of fabricating a semiconductor device package, the terminals on the upper surfaces of the leads for electrically connecting the electrodes of a semiconductor chip can be exposed out of the insulating material or can be left uncovered by the insulating material. Alternatively or additionally, the upper surface of the stage for bonding the semiconductor chip can be exposed out of the insulating material or can be left uncovered by the insulating material.

What is more, with the above-described method of fabricating a semiconductor device, a semiconductor chip is sealed in an insulating material and thereby protected from dust or dirt and humidity.

The above-mentioned method of fabricating a semiconductor device package according to the present invention preferably comprises the step of plating for bonding the terminals on the upper surfaces of the portions to be formed with the leads (hereinafter referred to as "the lead-forming portions") and/or on the upper surface of the portion to be formed with a stage (hereinafter referred to as "the stage-forming portion").

With the above-mentioned method of fabricating a semiconductor device package, the terminals on the upper surfaces of the lead-forming portions can be plated for easily and securely bonding the electrodes of the semiconductor chip thereto with or without the intermediary wires or the like. Alternatively or additionally, the upper surface of the stage-forming portion can be plated for easily and securely bonding the semiconductor chip.

The method of fabricating the third or fourth semiconductor device of this invention preferably comprises the steps of depositing a reinforcing insulating material continuously over the upper surfaces and the side surfaces of a plurality of leads with or without the side surface of the stage except for the terminals on the upper surfaces of the leads and coupling a plurality of the leads to each other and/or the leads and the stage to each other integrally through the reinforcing insulating material.

According to the above-mentioned method of fabricating a semiconductor device package, a plurality of the leads coupled to each other and/or the leads and the stage can be coupled to each other securely and integrally by the reinforcing insulating material as well as by the insulating material.

Also, the method of fabricating the third semiconductor device package according to the invention preferably comprises the step of continuously depositing an insulating material on the lower surface of the stage as well as on the side surfaces of the stage.

With this method of fabricating a semiconductor device package, the stage can be securely and integrally coupled to the leads by use of the insulating material deposited continuously on the lower surface as well as on the side surfaces of the stage.

On the other hand, a method of fabricating a semiconductor device according to this invention preferably comprises the step of forming soldering bumps on the terminals on the lower surfaces of the leads and/or on the lower surface of the stage.

With this method of fabricating a semiconductor device, the soldering bumps can be formed on the terminals on the lower surfaces of the leads for easily and securely connecting the terminals on the lower surfaces of the leads to the terminals of the electronic circuits formed on the board surface. Alternatively or additionally, a soldering bump can be formed on the lower surface of the stage for easily and securing connecting by soldering the stage to a metal stage coupling formed on the board surface.

A method of fabricating a second semiconductor device according to the invention preferably comprises the step of exposing the reverse surface of a semiconductor chip from the sealing insulating material and covering the reverse surface of the chip with a heat spreader.

With this method of fabricating a semiconductor, a heat spreader can be formed in the semiconductor device so that the heat generated by the semiconductor chip can be efficiently dissipated out of the semiconductor.

According to another aspect, a semiconductor device of this invention comprises: a plurality of leads and a stage for mounting a semiconductor chip arranged in juxtaposition at predetermined spatial intervals; a protruded terminal formed at a predetermined portion on the lower surface of each of said leads; and means for electrically connecting the electrodes of said semiconductor chip to the terminals on said upper surfaces of said leads; and an insulating material deposited in a continuous layer on the upper surfaces and the side surfaces of a plurality of said leads and on the upper surface and the side surfaces of said stage; wherein a plurality of said leads and said stage are integrally coupled to each other through said insulating material, said semiconductor chip is sealed in said insulating material, and the terminals on the lower surfaces of said leads are exposed out of said insulating material.

According to a further aspect, a semiconductor device of this invention comprises: a plurality of leads arranged in juxtaposition at predetermined spatial intervals; a protruded terminal formed at a predetermined portion of the lower surface of each of said leads; a semiconductor chip arranged above said leads; means for electrically connecting the electrodes of said semiconductor chip to the terminals on the upper surfaces of said leads; and an insulating material deposited in a continuous layer on the upper surfaces and the side surfaces of said leads; wherein a plurality of said leads are integrally coupled to each other through said insulating material, said semiconductor chip is sealed in said insulating material, and the terminals on the lower surfaces of said leads are exposed out of said insulating material.

In the above-mentioned semiconductor device, the terminals on the upper surfaces of the leads and the terminals on the lower surfaces of the leads are electrically connected to each other through the respective leads.

As a result, the need is eliminated for forming a plurality of through holes in an insulating material, forming a plurality of conductive layers on the inner peripheral surfaces of the holes by the electroless plating method or by the electrolytic plating method, and then electrically connecting the terminals on the upper surfaces of the leads and the terminals on the lower surfaces of the leads to each other through the conductive layers.

Also, it is possible to electrically insulate a plurality of the leads from each other and/or the leads and the stage from each other by the insulating material interposed therebetween.

Further, the terminals which are protruded from a predetermined portion of the lower surfaces of the leads and exposed out of the insulating material can be connected by soldering to the terminals of the electronic circuits formed on the board surface. In this way, the semiconductor device can be mounted on the board surface.

In the process, the lower surface of the semiconductor device can be raised above the board surface by an amount equivalent to the length of the terminals protruded from the lower surfaces of the leads taking advantage of the protruded terminals formed to stand off on the lower surfaces of the leads.

Furthermore, the semiconductor chip, which is sealed in the insulating material, is protected from dust or dirt and humidity which otherwise might cause a malfunction of the semiconductor chip.

A semiconductor device according to the invention preferably has a structure in which the terminals on the upper surfaces of the leads and/or the upper surface of the stage are plated for bonding.

With this semiconductor device, wires or the like for electrically connecting the electrodes of the semiconductor chip to the leads can be easily and securely bonded to the terminals on the upper surfaces of the leads plated for bonding, and the electrodes of the semiconductor chip can be easily and securely flip-chip bonded to the same terminals. Alternatively or additionally, the semiconductor chip can be easily and securely bonded to the upper surface of the stage plated for bonding.

A semiconductor device according to the present invention preferably has a structure in which the protruded terminals formed on the lower surfaces of the leads and/or the lower surface of the stage are formed with at least a soldering bump.

With this semiconductor device, the terminals on the lower surfaces of the leads can be easily and securely connected by soldering to the terminals of the electronic circuits formed on the board surface using the soldering bumps formed on the terminals on the lower surfaces of the leads. Alternatively or additionally, the lower surface of the stage can be easily and securely connected by soldering to a metal stage coupling formed on the board surface by use of the soldering bump formed on the lower surface of the stage.

A semiconductor device according to the invention preferably has a structure in which the reverse surface of the semiconductor chip is exposed outside the insulating material and a heat spreader is deposited on the reverse surface of the chip.

With this semiconductor device, the heat generated from the semiconductor chip can be efficiently dissipated out of the semiconductor device through the heat spreader deposited on the reverse surface of the chip.

A further method of fabricating a semiconductor device comprises the steps of:

etching a plurality of predetermined portions of the upper surface of a metal plate, forming a plurality of contour blind grooves with a predetermined pattern in the upper surface of said metal plate, and forming a plurality of lead-forming portions and a stage-forming portion juxtaposed and defined by said contour blind grooves on said metal plate;

bonding a semiconductor chip on the upper surface of said stage-forming portion thereby to electrically connect the electrodes of said semiconductor chip to the terminals on the upper surfaces of said lead-forming portions;

depositing a continuous layer of an insulating material on the upper surfaces and the side surfaces of a plurality of said lead-forming portions, the upper surface and the side surfaces of said stage-forming portion and the inner side surfaces of said contour blind grooves interposed therebetween, integrally coupling a plurality of said lead-forming portions and said stage-forming portion to each other through said insulating material, and sealing said semiconductor chip in said insulating material; and etching a plurality of predetermined portions of the lower surface of said metal plate, forming a plurality of contour grooves in the lower surface portions of the metal plate just under said contour blind grooves, respectively, separating a plurality of said lead-forming portions from each other and said lead-forming portions and stage-forming portion from each other by said contour grooves, forming a plurality of said leads and said stage in juxtaposition at predetermined spatial intervals, exposing said insulating material between said contour grooves, and forming a protruded terminal at a predetermined portion of the lower surface of each of said leads.

A still further method of fabricating a semiconductor device comprises the steps of:

etching a plurality of predetermined portions of the upper surface of a metal plate, forming a plurality of contour blind grooves with a predetermined pattern in the upper surface of said metal plate, and forming a plurality of lead-forming portions juxtaposed and defined by said contour blind grooves on said metal plate;

arranging a semiconductor chip above said lead-forming portions and electrically connecting the electrodes of said semiconductor chip to the terminals on the upper surfaces of said lead-forming portions;

depositing a continuous layer of an insulating material on the upper surfaces and the side surfaces of a plurality of said lead-forming portions and the inner side surfaces of said contour blind grooves interposed therebetween, integrally coupling a plurality of said lead-forming portions to each other through said insulating material, and sealing said semiconductor chip in said insulating material; and etching a plurality of predetermined portions of the lower surface of said metal plate, forming a plurality of contour grooves in the lower surface portions of the metal plate just under said contour blind grooves, respectively, separating a plurality of said lead-forming portions from each other by said contour grooves, forming a plurality of said leads in juxtaposition at predetermined spatial intervals, exposing said insulating material between said contour grooves, and forming a protruded terminal at a predetermined portion of the lower surface of each of said leads.

According to a method of fabricating a semiconductor device, a plurality of predetermined portions of the upper and lower surfaces of a metal plate are etched, so that a plurality of leads with or without a stage can be formed at predetermined spatial intervals. At the same time, a protruded terminal can be formed at each of a plurality of predetermined portions on the lower surfaces of the leads.

Also, a plurality of the leads and the stage formed by etching a plurality of predetermined portions of the upper and lower surfaces of the metal plate can be integrally coupled to each other through the insulating material. At the same time, a plurality of the leads and/or the leads and the stage can be electrically insulated from each other by the insulating material interposed therebetween.

Further, the terminals on the upper surfaces of the leads can be electrically connected to the protruded terminals formed on lower surfaces of the leads through the leads. Thus, it is not necessary to of form a plurality of through holes in the insulating material corresponding to the substrate, form a plurality of conductive layers on the inner peripheral surfaces of the holes by the electroless plating method or the electrolytic plating method, and then electrically connect the terminals on the upper surfaces of the leads to the protruded terminals formed on the lower surfaces of the leads.

Also, the semiconductor chip can be sealed in the insulating material and thus can be protected from dust or dirt and humidity.

The method of fabricating a semiconductor device according to the invention preferably comprises the step of plating for bonding the terminals on the upper surfaces of the lead-forming portions and/or the upper surface of the stage-forming portion.

According to the method of fabricating a semiconductor device described above, a plurality of wires or the like for electrically connecting the electrodes of the semiconductor chip to the leads can be easily and securely bonded to the terminals on the upper surfaces of the lead plated for bonding, and the electrodes of the semiconductor chip can be easily and securely flip-chip bonded to the same terminals. Alternatively or additionally, the semiconductor chip can be easily and securely bonded to the upper surface of the stage plated for bonding.

According to this method of fabricating a semiconductor device, a semiconductor device can be formed in which the terminals on the lower surfaces of the leads can be easily and securely connected by soldering to the terminals of the electronic circuits formed on the board surface by the use of the soldering bumps formed on the terminals on the lower surfaces of the leads. Alternatively or additionally, a semiconductor device can be formed in which the lower surface of the stage can be easily and securely connected by soldering to a metal stage coupling formed on the board surface by the use of the soldering bump formed on the lower surface of the stage.

DESCRIPTION OF THE PREFERRED EMBODIMENTS

Now, embodiments of the invention will be explained with reference to the accompanying drawings.

Figure 1:
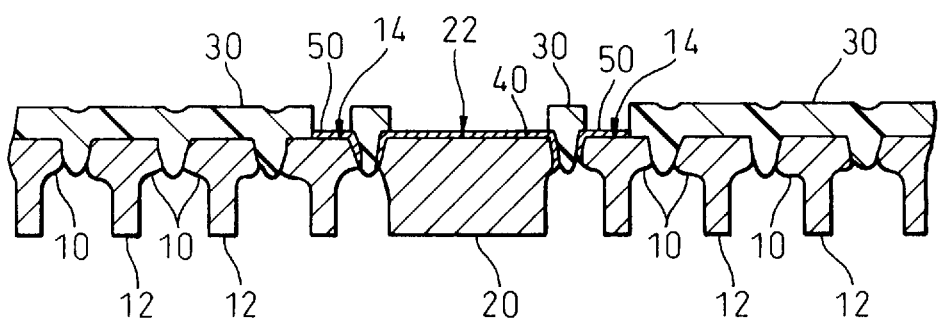
FIGS. 1 and 2 are a sectional view and a bottom view, respectively, of a first semiconductor device package according to the present invention.
Figure 2:
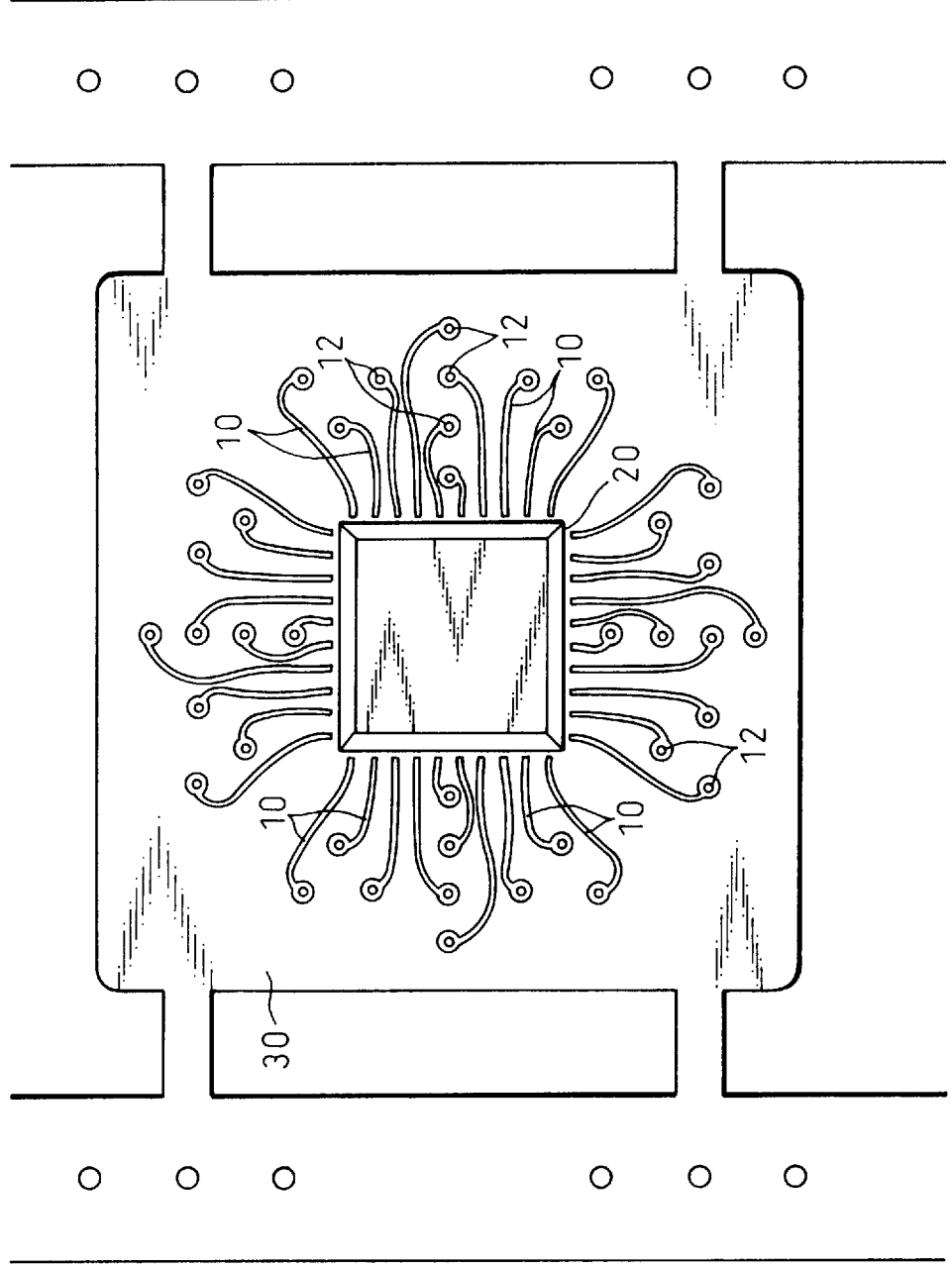

FIGS. 1 and 2 show a preferred embodiment of a first semiconductor device package according to the invention. Specifically, FIG. 1 is a sectional view, and FIG. 2 a bottom view thereof. In FIGS. 1 and 2, reference numeral 10 designates a plurality of thin leads arranged in juxtaposition, and numeral 20 a rectangular stage arranged at substantially the central portion in the arrangement of a plurality of the leads 10. A predetermined portion of the lower surface of each lead 10 is formed with a protruded terminal 12 for connecting by soldering to the terminal of an electronic circuit formed on the surface of a board. A plurality of the leads 10 and the stage 20 are arranged horizontally at predetermined spatial intervals. A plurality of the leads 10 and the stage 20 are formed of a metal plate of copper, a copper alloy, an iron-nickel alloy or an iron-nickel-cobalt alloy or the like. A continuous layer of an insulating material 30 of epoxy resin or polyimide resin is deposited on the upper and side surfaces of the leads 10 and the side surface of the stage 20. The leads 10 and the stage 20 are integrally coupled to each other through the insulating material 30. At the same time, a plurality of the leads 10 are electrically insulated from each other and therefore the leads 10 and stage 20 are also electrically insulated from each other by the insulating material 30 interposed therebetween. The upper surface 22 of the stage for bonding a semiconductor chip, the terminals 14 formed on the upper surfaces of the leads and the terminals 12 formed on the lower surfaces of the leads are exposed out of the insulating material 30. The terminals 14 on the upper surfaces of the leads are covered by a plating layer 50 of silver or the like for bonding. In similar fashion, the upper surface 22 of the stage is covered by a plating layer 40 of silver or the like for bonding a semiconductor chip. The stage 20 is formed as thick as the length of the terminals 12 protruded from the lower surfaces of the leads 10. The lower surface of the stage 20 is thus adapted to be connected by soldering to a stage coupling portion of a metal formed on the board surface.

Figure 3:
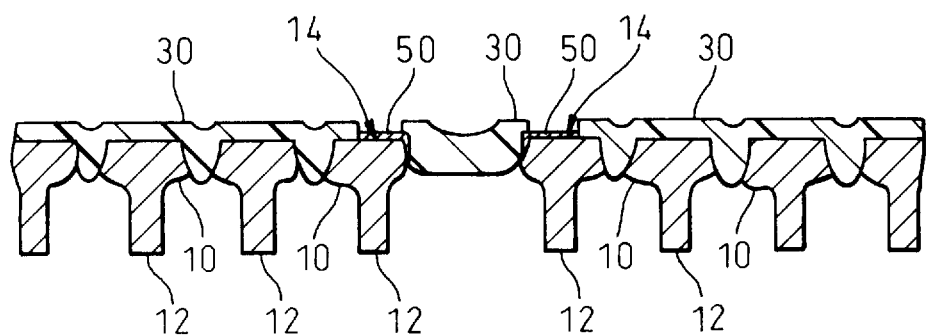
FIG. 3 is a sectional view of a second semiconductor device package according to the invention.

FIG. 3 is a sectional view of a preferred embodiment of a second semiconductor device package according to the invention. In this semiconductor device package, a stage is not juxtaposed with leads 10, but only a plurality of the leads 10 are arranged horizontally at predetermined spatial intervals. The upper surfaces and the side surfaces of the leads 10 are deposited with a continuous layer of an insulating material 30. A plurality of the leads 10 are thus integrally coupled to each other through the insulating material 30. At the same time, the leads 10 are electrically insulated from each other by the insulating material 30 interposed therebetween. The terminals 14 on the upper surfaces of the leads and the terminals 12 on the lower surfaces of the leads are exposed out of the insulating material 30. The remaining component parts, except for the stage, are configured the same way as the first semiconductor device package described above.

Figure 4:
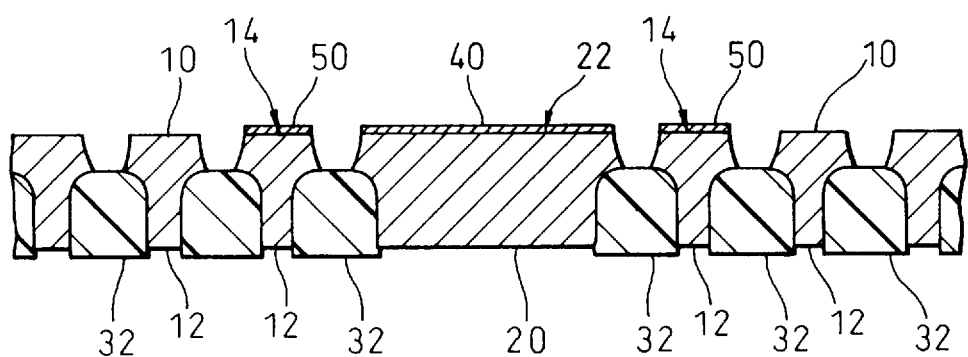
FIGS. 4 and 5 are a sectional view and a bottom view, respectively, of a third semiconductor device package according to the invention.
Figure 5:
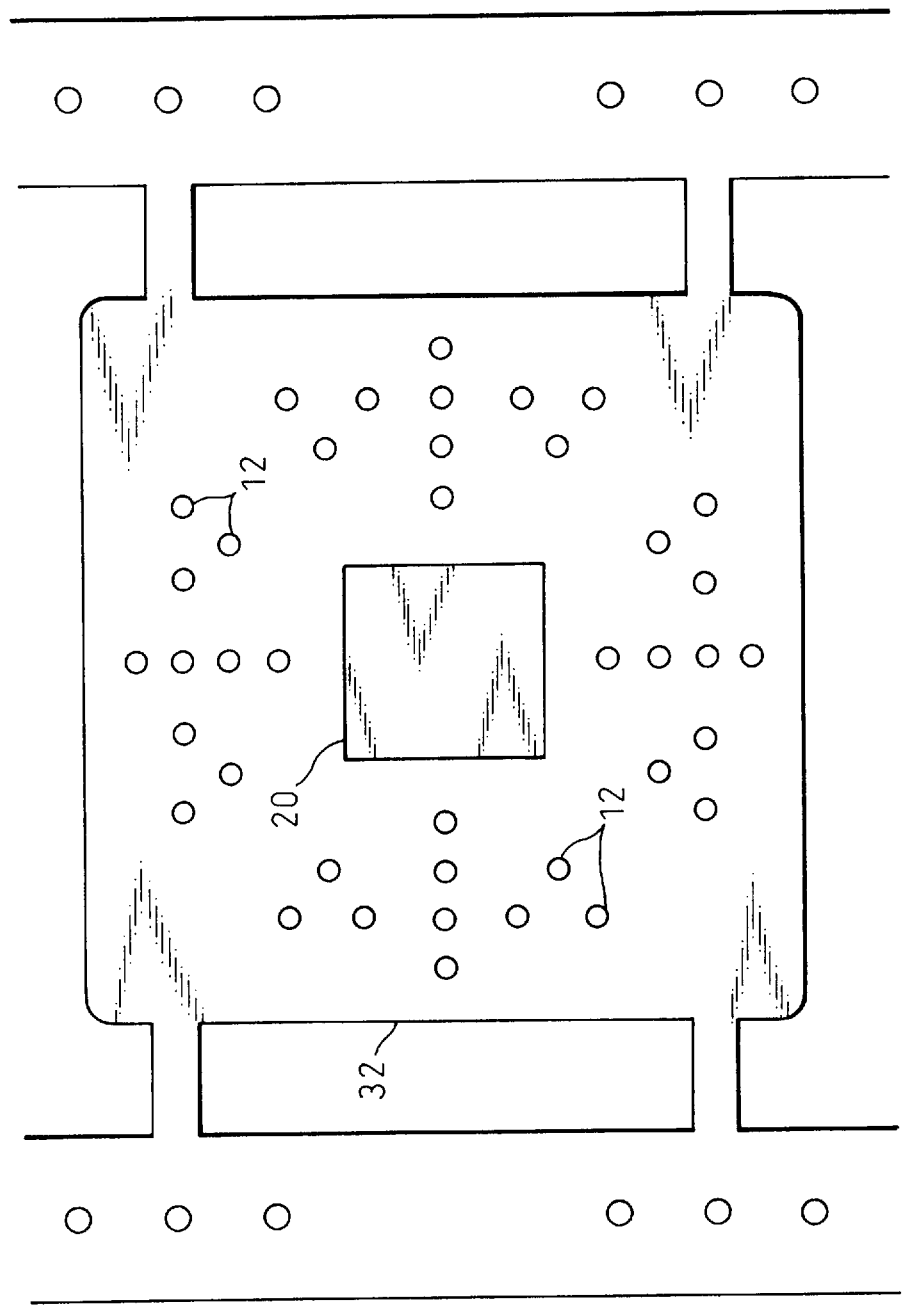

FIGS. 4 and 5 show a preferred embodiment of a third semiconductor device package according to the invention. Specifically, FIG. 4 is a sectional view and FIG. 5 is a bottom view thereof. With this third semiconductor device package, a plurality of leads 10 and a stage 20 are arranged horizontally at predetermined spatial intervals. The lower surfaces and the side surfaces of the leads 10 and the side surfaces of the stage 20 are deposited with a continuous layer of an insulating layer 32 of photosensitive polyimide resin or normal polyimide resin, epoxy resin or the like. The leads 10 and the stage 20 are integrally coupled to each other through the insulating material 32. At the same time, a plurality of the leads 10 are electrically insulated from each other by the insulating material 32 interposed therebetween, and the leads 10 and the stage 20 are also electrically insulated from each other. The terminals 12 on the lower surfaces of the leads are exposed out of the insulating material 32. In similar manner, the lower surface of the stage 20 is exposed out of the insulating material 32. The terminals 14 on the upper surfaces of the leads are deposited with a plating layer 50 of silver or the like for bonding. In similar fashion, the upper surface 22 of the stage is also deposited with a plating layer 40 of silver or the like for bonding a semiconductor chip.

Figure 6:
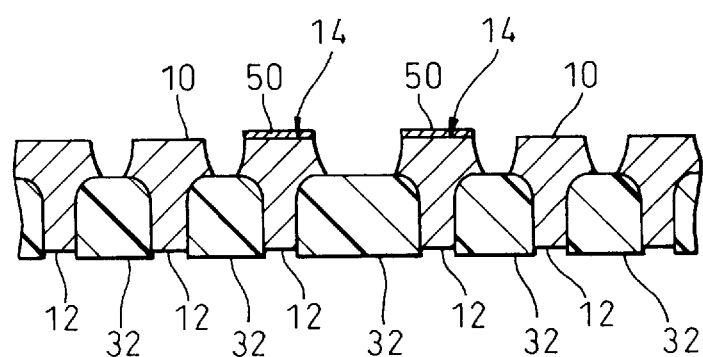
FIG. 6 is a sectional view of a fourth semiconductor device package according to the invention.

FIG. 6 is a sectional view of a preferred embodiment of a fourth semiconductor device package according to the invention. With the fourth semiconductor device package, a stage is not juxtaposed with leads 10, but only a plurality of the leads 10 are horizontally arranged at predetermined spatial intervals. The lower surfaces and the side surfaces of the leads 10 are deposited with a continuous layer of an insulating material 32 of photosentive polyimide resin or normal polyimide resin, epoxy resin or the like. A plurality of the leads 10 are integrally coupled to each other through the insulating materials 32. At the same time, the leads 10 are electrically insulated from each other by the insulating material 32 interposed therebetween. The terminals on the lower surfaces of the leads are exposed out of the insulating material 32. The remaining component parts, except for the stage, are similarly configured to the third semiconductor device package described above.

Now, an explanation will be made about the first or second semiconductor device which can be formed using the first, second, third or fourth semiconductor device package according to a preferred embodiment of the invention.

Figure 7:
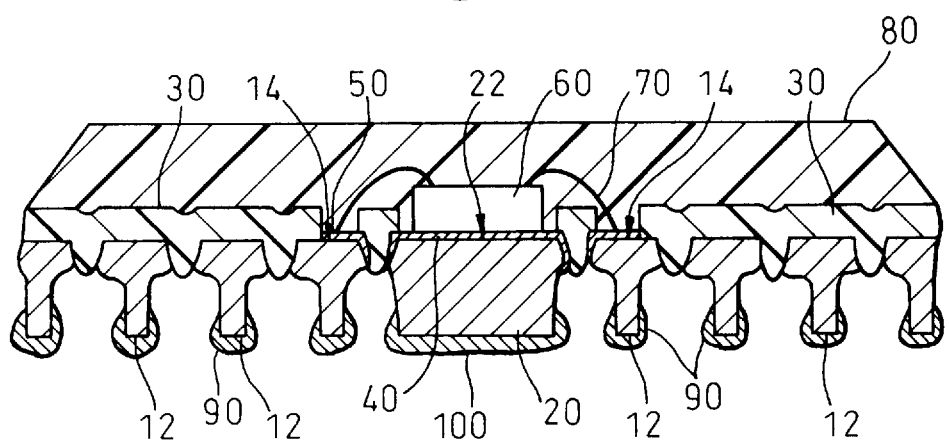
FIGS. 7 and 8 are sectional views of a first semiconductor device according to the invention.
Figure 8:
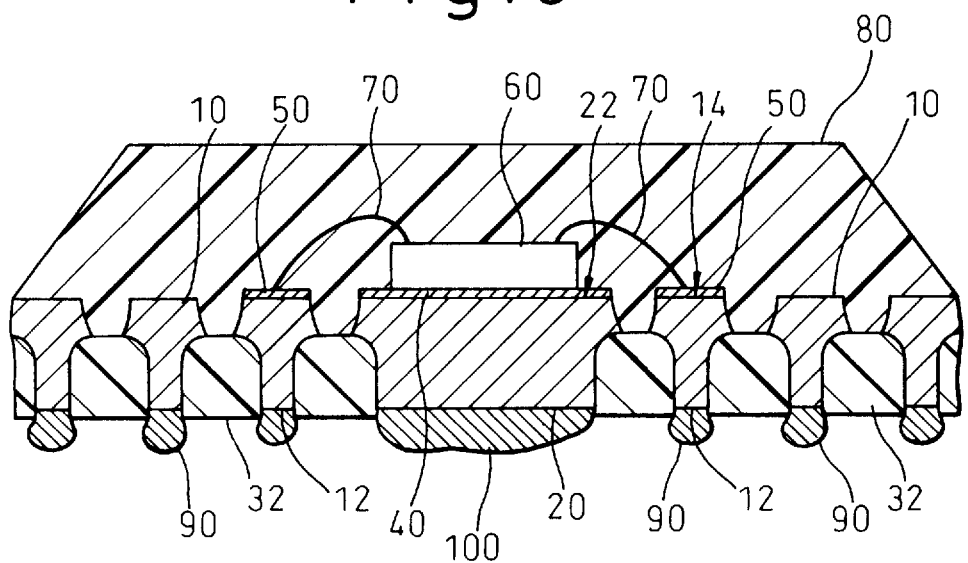

FIGS. 7 and 8 are sectional views showing a preferred embodiment of the first semiconductor device according to the invention.

In the first semiconductor device, a semiconductor chip 60 is bonded on the upper surface 22 of the stage deposited with a plating layer 40 for bonding the first or third semiconductor device package described above. The semiconductor chip 60 is mounted on the stage 20. The electrodes of the semiconductor chip 60 are electrically connected through wires 70 to the terminals 14 on the upper surfaces of the leads deposited with the plating layer 50. The upper surface of the stage 20 and the upper surfaces of the leads 10 are deposited with a layer of a sealing insulating material 80 of polyimide resin, epoxy resin or the like directly or through the bonding plating layers 40, 50 and the insulating layer 30. The semiconductor chip 60 and the wires 70 are sealed in the sealing insulating material 80, thereby protecting the semiconductor chip 60 and the wires 70 from dust or dirt and humidity. The terminals 12 on the lower surfaces of the leads are formed with soldering bumps 90. In similar fashion, the lower surface of the stage 20 is formed with a soldering bump 100. In this first semiconductor device, the terminals 12 on the lower surfaces of the leads can be connected by soldering to the terminals of the electronic circuits formed on the board surface using the soldering bumps 90 formed on the terminals 12 on the lower surfaces of the leads. The first semiconductor device thus can be mounted on the surface of the board. In the process, the stage 20 can be connected by soldering to a stage-coupling metal formed on the board surface using the soldering bump 100 formed on the lower surface of the stage 20. The heat generated by the semiconductor chip 60 bonded to the upper surface 22 of the stage can thus be efficiently released to the board through the stage 20.

Figure 9:
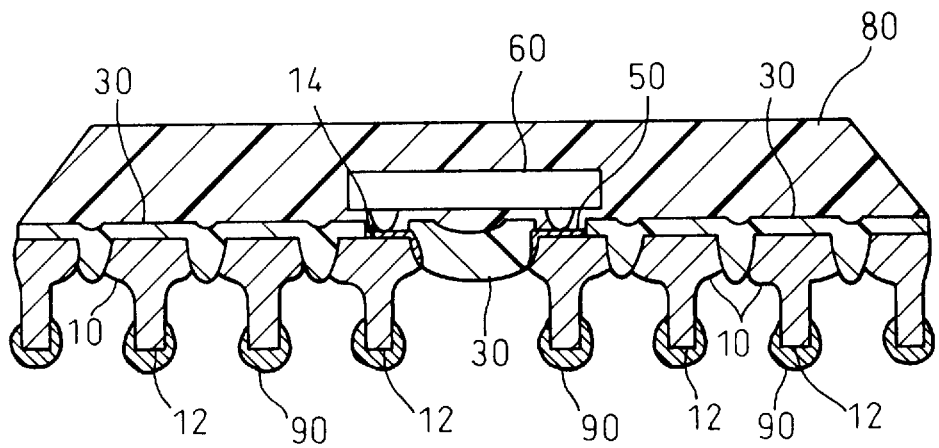
FIGS. 9 and 10 are sectional views of a second semiconductor device according to the invention.
Figure 10:
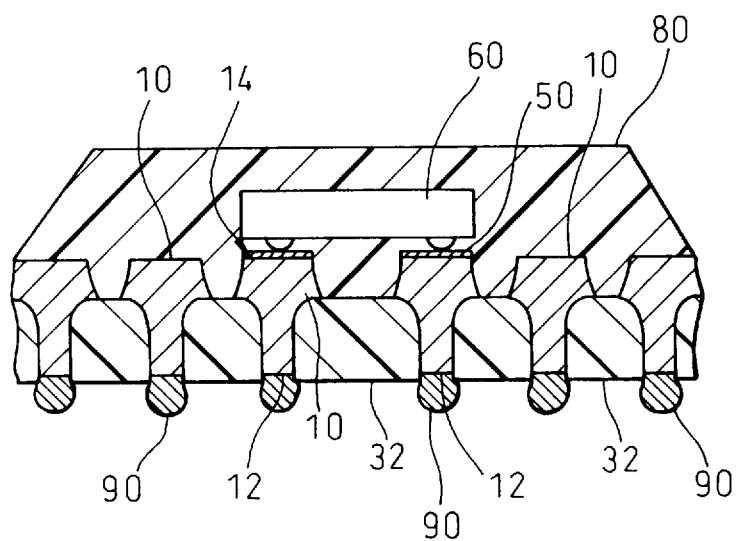

FIGS. 9 and 10 are sectional views showing the second semiconductor device according to preferred embodiments of the invention. With this second semiconductor device, a semiconductor chip 60 is arranged above the leads 10 of the second or fourth semiconductor device package described above. The electrodes of the semiconductor chip 60 are electrically connected by flip chip bonding to the terminals 14 on the upper surfaces of the leads deposited with a plating layer 50 just under the electrode. The upper surfaces of the leads 10 are deposited with a layer of a sealing insulating material 80 of epoxy resin, polyimide resin or the like directly or through the insulating material 30 and the bonding plating layer 50. The semiconductor chip 60 is sealed in the sealing insulating material 80 thereby to protect the semiconductor chip 60 from dust or dirt and humidity. The other component parts, except for the stage, are similar to those of the first semiconductor device shown in FIG. 7 or 8. The function of the semiconductor device according to this embodiment, except for the function of the stage, is similar to those of the first semiconductor device shown in FIG. 7 or 8.

Now, an explanation will be made about a method of fabricating the first semiconductor device package shown in FIG. 1 according to a preferred embodiment.

Figure 11:
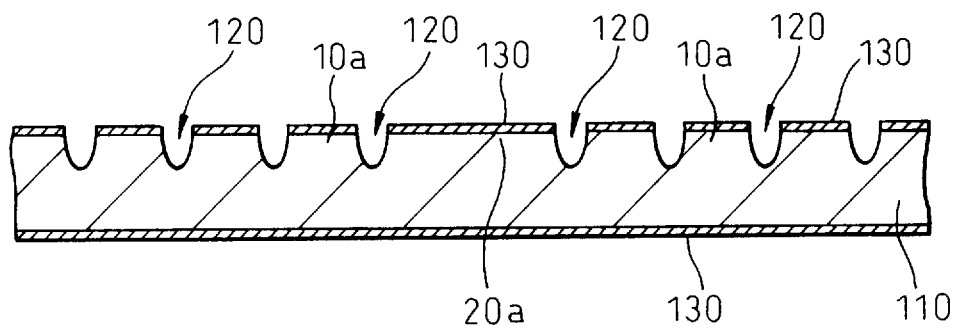
FIGS. 11 to 16 are diagrams for explaining a method of fabricating the first semiconductor device package according to the invention.
Figure 12:
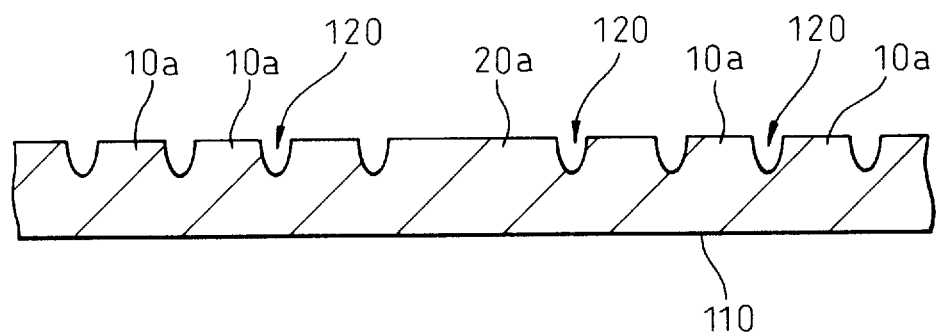
Figure 13:
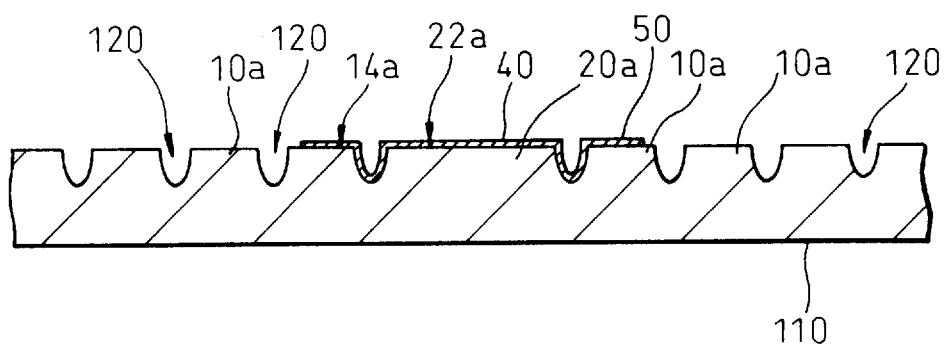

FIGS. 11 to 16 are diagrams for explaining the fabrication steps in a method of fabricating the first semiconductor device package according to a preferred embodiment of the invention. As shown in FIG. 11, a resist layer 130 is formed in a predetermined pattern on the upper surface of a metal plate 110. The lower surface and the side surfaces of the metal plate 110 are also formed with the resist layer 130. The metal plate 110 formed with these resist layers 130 is immersed in an etching bath thereby to etch the upper surface portion of the metal plate 110 exposed out of the resist layers 130. The upper surface of the metal plate 110 is formed with a plurality of contour blind grooves 120 in a predetermined pattern. After that, the resist layers 130 are separated from the surface of the metal plate 110. (FIG. 12) Then, as shown in FIG. 13, the remaining upper surface portions of the metal plate 110 except for the terminals 14a on the upper surfaces of the lead-forming portions, the upper surface 22a of the staging-forming portion and the inner side surfaces of the contour blind grooves 120 interposed therebetween are covered with a mask of rubber or the like (not shown). In this way, the bonding plating layers 40, 50 of silver or the like are applied to the terminals 14a on the upper surfaces of the lead-forming portions, the upper surface 22a of the stage-forming portion and the inner side surfaces of the contour blind grooves 120 interposed therebetween.

Figure 14:
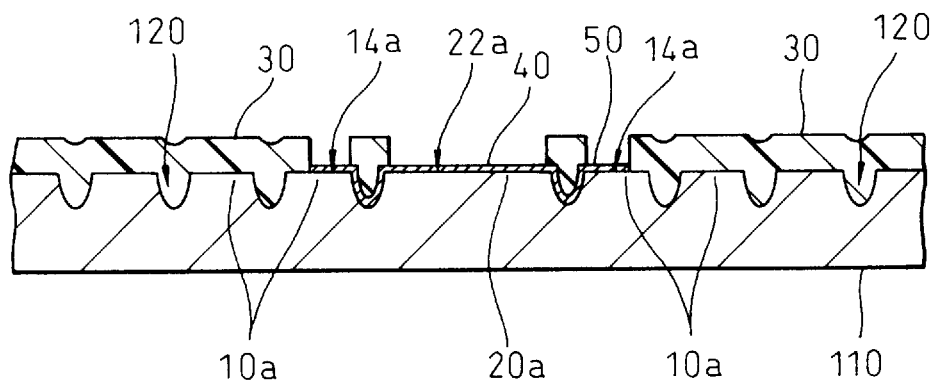

Then, as shown in FIG. 14, the upper surfaces and side surfaces of a plurality of the lead-forming portions 10a, the side surface of the stage-forming portion 20a and the inner side surfaces of the contour blind grooves 120 interposed therebetween, except for the terminals 14a on the upper surfaces of the lead-forming portions deposited with the bonding plating layers 50 and the upper surface 22a of the stage-forming portion deposited with the bonding plating layer 40, are deposited with a continuous layer of the insulating material 30 of epoxy resin, polyimide resin or the like by the transfer mold process or the potting process.

Figure 15:
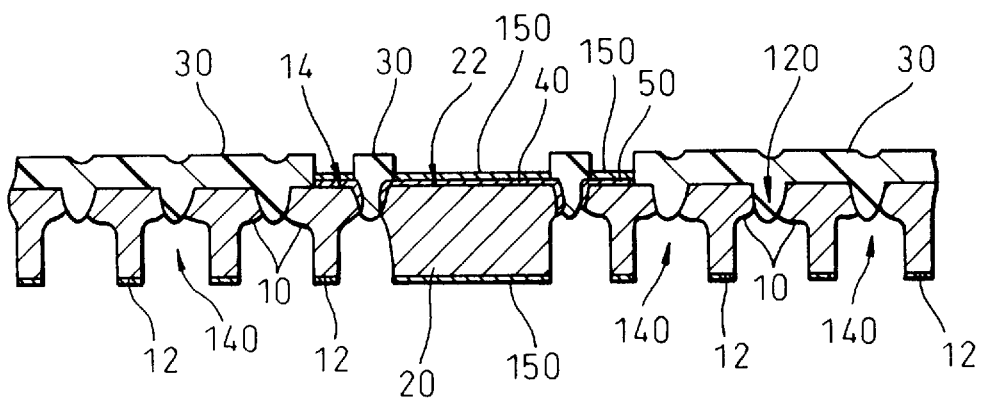

Then, as shown in FIG. 15, a plurality of predetermined portions of the lower surface of the metal plate 110 are etched, so that the lower surface portions of the metal plate 110 just under the contour blind grooves 120 are formed with contour grooves 140 having a substantially inverted-U section. The contour grooves 140 separate a plurality of the lead-forming portions 10a from each other and the lead-forming portions 10a and the stage-forming portion 20a from each other. The leads 10 and the stage 20 are arranged horizontally at predetermined spatial intervals. At the same time, the insulating material 30 is exposed between the contour grooves 140, so that a plurality of protruded terminals 12 are formed at predetermined portions of the lower surfaces of the leads 10.

Also, the leads 10 and the stage 20 are integrally coupled to each other through the insulating material 30. At the same time, the leads 10 are electrically insulated from each other, and so are the leads 10 and the stage 20, by means of the insulating material 30 interposed therebetween.

Figure 16:
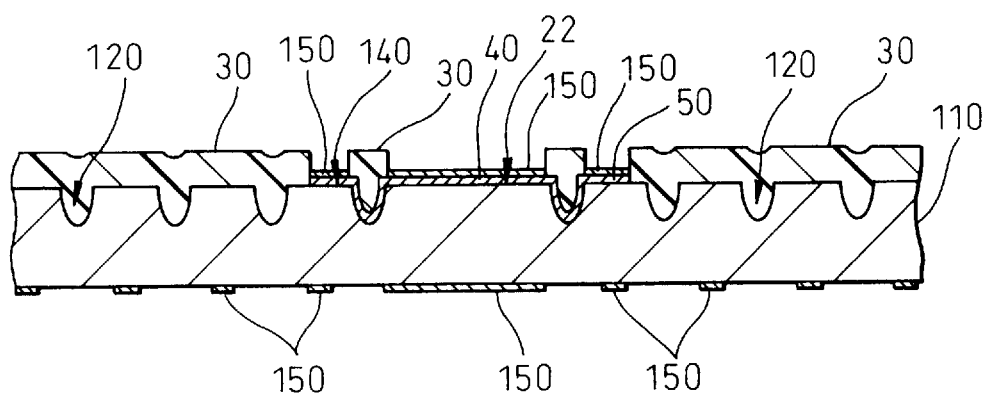

Specifically, as shown in FIG. 16, the lower surface of the metal plate 110 is formed with resist layers 150 in a predetermined pattern. Also, the remaining upper portion of the metal plate 110 exposed outside the insulating material 30 and the side surfaces of the metal plate 110 are formed with the resist layers 150. The metal plate 110 formed with these resist layers 150 is immersed in an etching bath thereby etching the lower surface portions of the metal plate 110 exposed between the resist layers 150. The lower surface of the metal plate 110 is formed with the contour grooves 140 in a predetermined pattern. After that, the resist layers 150 are separated from the surface of the metal plate 110.

Figure 17:
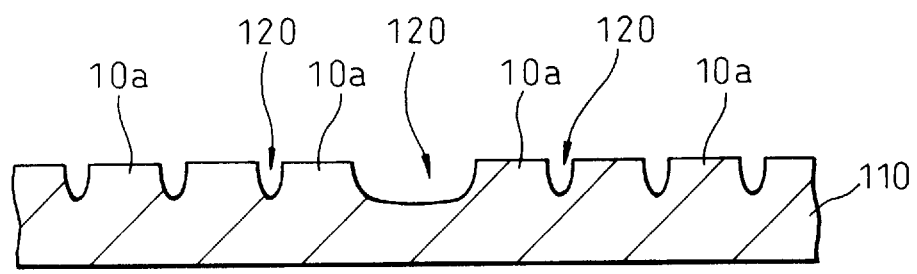
FIGS. 17 to 20 are diagrams for explaining a method of fabricating the second semiconductor device package according to the invention.
Figure 18:
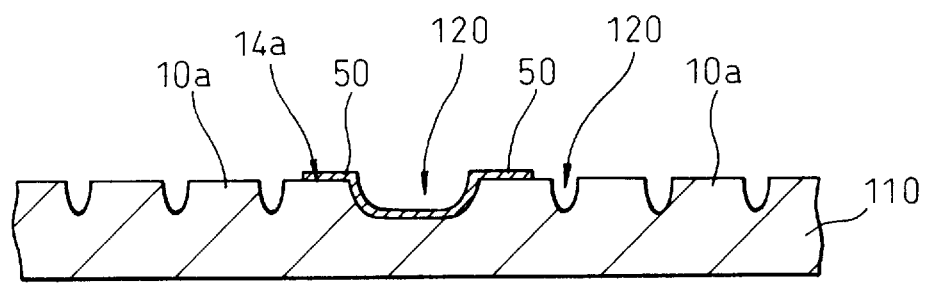
Figure 19:
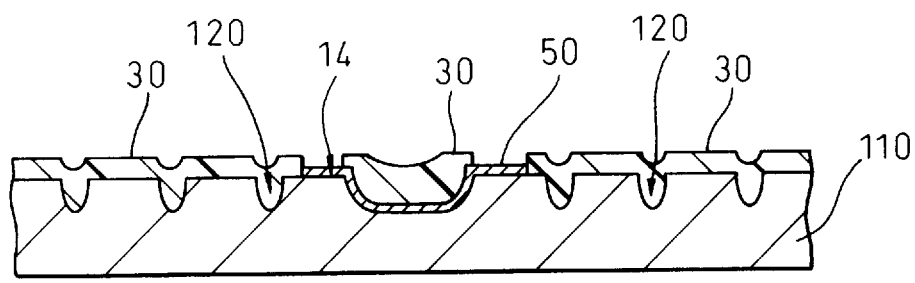
Figure 20:
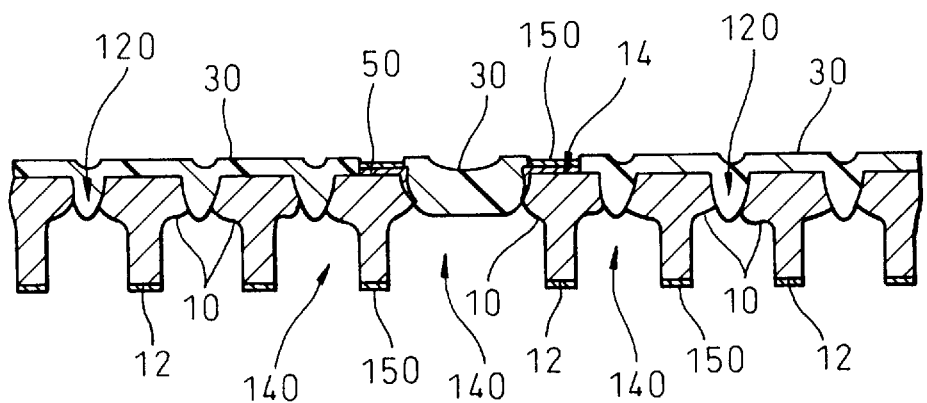

An explanation will be made about a method of fabricating the second semiconductor device package shown in FIG. 3 with reference to a preferred embodiment. FIGS. 17 to 20 are diagrams for explaining the steps of fabricating the second semiconductor device package according to a preferred embodiment of the invention. As shown in FIG. 17, a plurality of predetermined portions of the upper surface of the metal plate 110 are etched thereby to form contour grooves 120 having a substantially inverted-U section in a predetermined pattern on the upper surface of the metal plate 110. The metal plate 110 is formed with a plurality of lead-forming portions 10a juxtaposed and defined by the contour blind grooves 120. Then, as shown in FIG. 18, a plating layer 50 of silver or the like for bonding is deposited on the terminals 14a on the upper surfaces of the lead-forming portions. As the next step, as shown in FIG. 19, the upper surfaces and the side surfaces of a plurality of the lead-forming portions 10a and the inner side surfaces of the contour blind grooves 120 interposed therebetween, except for the terminals 14a of the upper surfaces of the lead-forming portions covered with the bonding plating layer 50, are deposited with a continuous layer of the insulating material 30 of epoxy resin, polyimide resin or the like by means of the transfer mold process or the potting process. Then, as shown in FIG. 20, predetermined portions of the lower surface of the metal plate 110 are etched thereby to form contour grooves 140 having a substantially inverted-U section in the lower surface portions of the metal plate 110 just under the contour blind grooves 120. The contour grooves 140 separate a plurality of the lead-forming portions 10a from each other. The leads 10 are formed horizontally at predetermined spatial intervals. At the same time, the insulating material 30 is exposed between the contour grooves 140, and the terminals 12 protrude from the predetermined portions of the lower surfaces of the leads 10, respectively. Also, the leads 10 are integrally coupled to each other through the insulating material 30. At the same time, the leads 10 are insulated from each other electrically by means of the insulating material 30 interposed therebetween.

Figure 21:
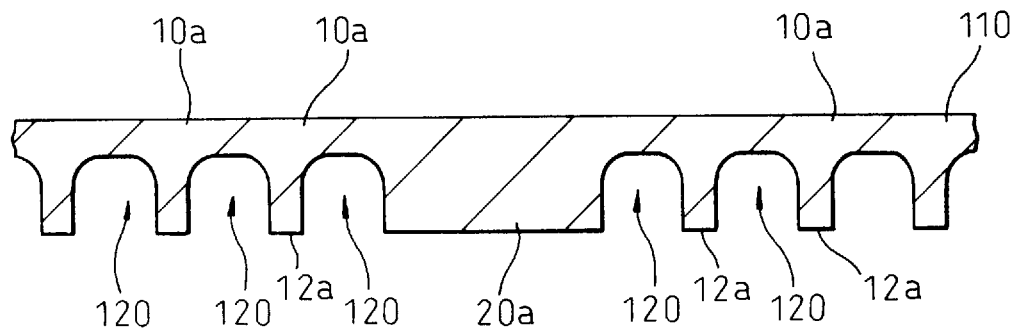
FIGS. 21 to 25 are diagrams for explaining a method of fabricating the third semiconductor device package according to the invention.
Figure 22:
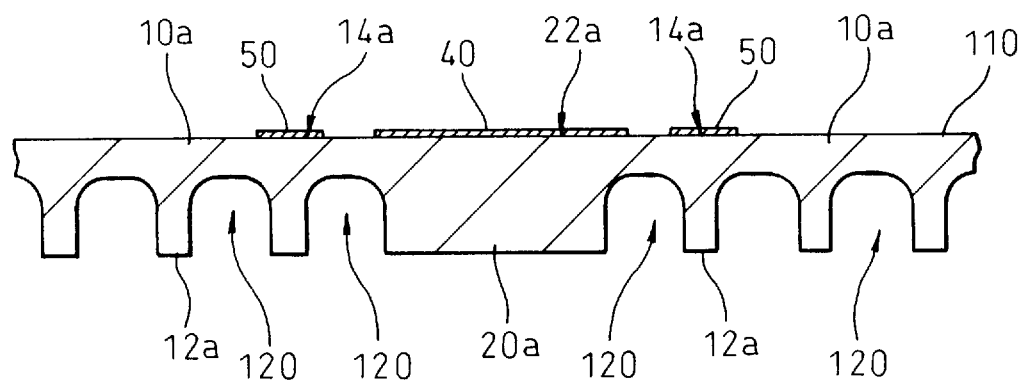
Figure 23:
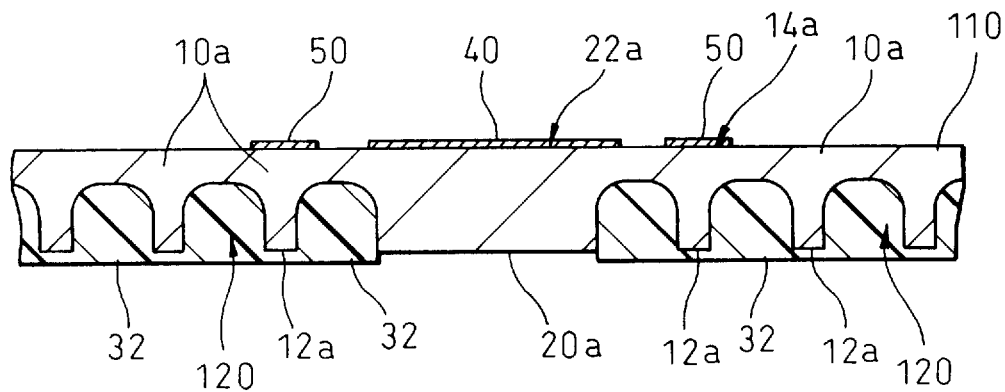

An explanation will be made about a method of fabricating the third semiconductor device package according to a preferred embodiment shown in FIGS. 4 and 5. FIGS. 21 to 25 are diagrams for explaining the steps of fabricating the third semiconductor device package according to a preferred embodiment. As shown in FIG. 21, predetermined portions of the lower surface of a metal plate 110 are etched, and thereby a plurality of contour blind grooves 120 having a substantially inverted-U section are formed in a predetermined pattern on the lower surface of the metal plate 110. The metal plate 110 is formed with a plurality of lead-forming portions 10a and a stage-forming portion 20a juxtaposed and defined by the contour blind grooves 120. As shown in FIG. 22, the upper surface portions of the metal plate 110, except for the terminals 14a on the upper surfaces of the lead-forming portions and the upper surface 22a of the stage-forming portion, are covered with a mask of rubber or the like (not shown). In this way, the terminals 14a on the upper surfaces of lead-forming portions and the upper surface 22a of the stage-forming portion are deposited with the bonding plating layers 40, 50, respectively, of silver or the like. Then, as shown in FIG. 23, the lower surfaces and the side surfaces of a plurality of the lead-forming portions 10a, the side surfaces of the stage-forming portion 20a and the inner side surfaces of the contour blind grooves 120 interposed therebeween are deposited with a continuous layer of the insulating material 32 of photosensitive polyimide resin, normal polyimide resin, epoxy resin or the like by the transfer mold process or the potting process.

Figure 24:
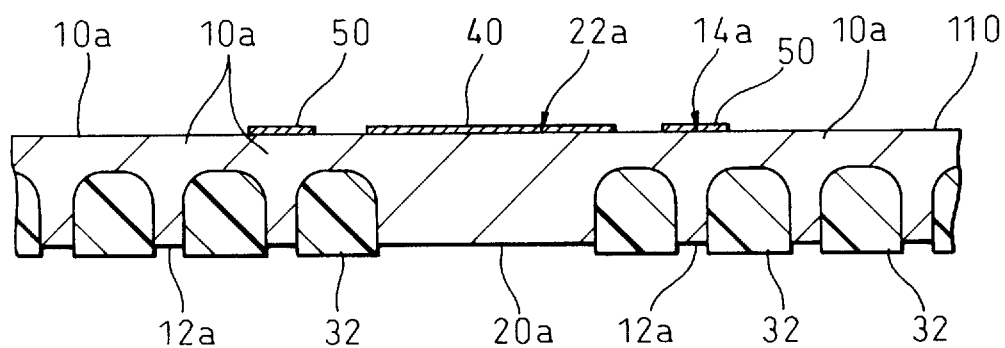
Figure 25:
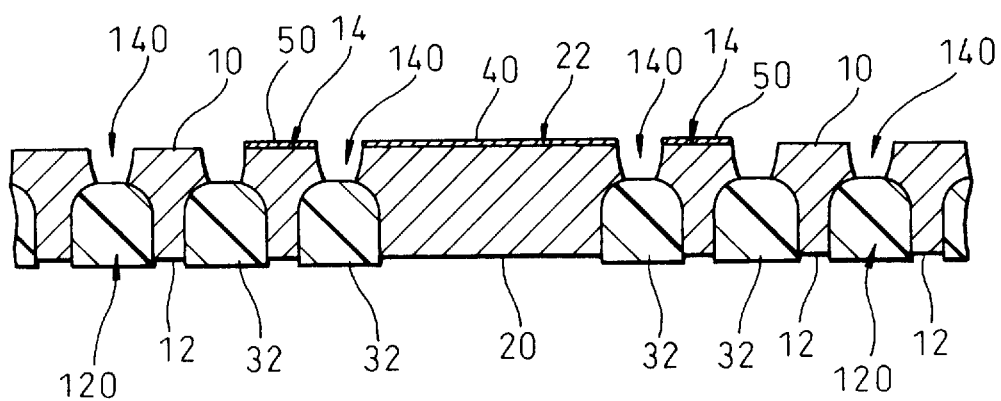

Now, as explained in FIG. 24, the insulating material 32, if made of a photosensitive material, is directly exposed and developed thereby to remove the insulating material 32 of the photosensitive resin just under the terminals 12a of the lower surfaces of the lead-forming portions. In the case where the insulating material 32 is made of a normal material, on the other hand, the surface of the insulating material 32 is formed with a resist layer (not shown) in a predetermined pattern, and the portions of the insulating layer 32 formed with the resist layer are exposed and developed. In this way, the insulating material 32 of normal resin just under the terminals 12a of the lower surfaces of the lead-forming portions is removed. Then, as shown in FIG. 25, a plurality of predetermined portions of the upper surface of the metal plate 110 are etched to form contour grooves 140 having a substantially U-shaped section in the upper surface portions of the metal plate 110 just above the contour blind grooves 120. The contour grooves 140 separate a plurality of the lead-forming portions 10a from each other and also separate the lead-forming portions 10a from the stage-forming portion 20a. The leads 10a and the stage 20 are formed horizontally at predetermined spatial intervals. At the same time, the insulating layer 32 is exposed between the contour grooves 140. Also, a plurality of the leads 10 and the stage 20 are integrally coupled to each other through the insulating material 32. At the same time, the leads 10 are electrically insulated from each other and the leads 10 and the stage 20 by the insulating material 32 interposed therebetween.

Figure 26:
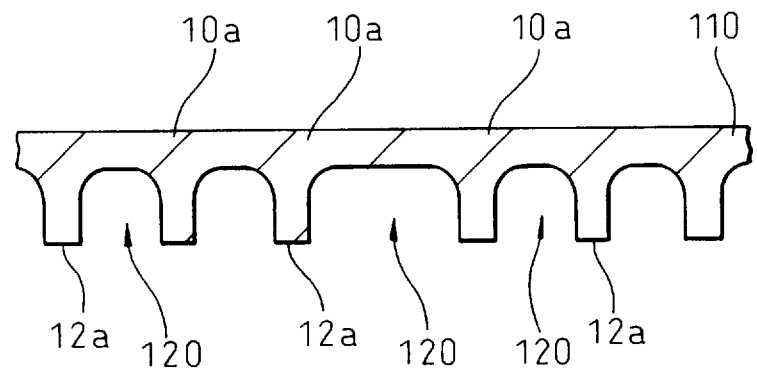
FIGS. 26 to 30 are diagrams for explaining a method of fabricating the fourth semiconductor device package according to the invention.
Figure 27:
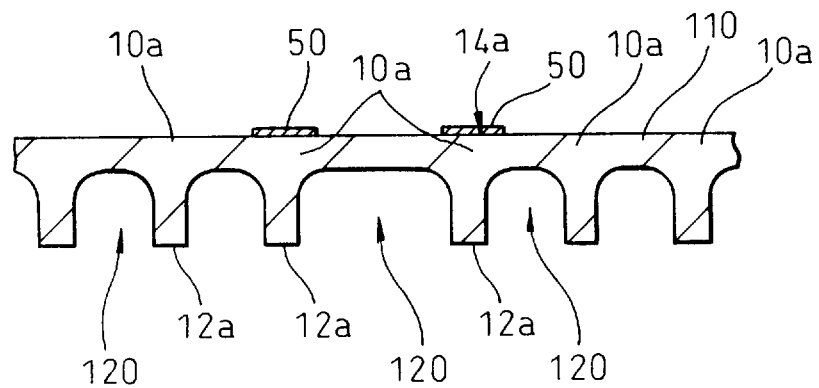
Figure 28:
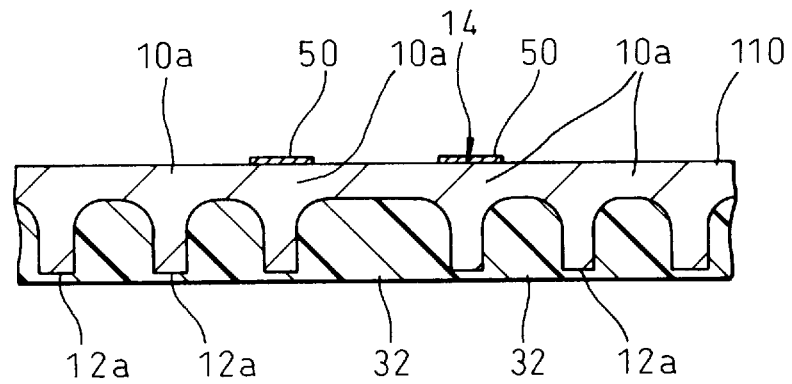
Figure 29:
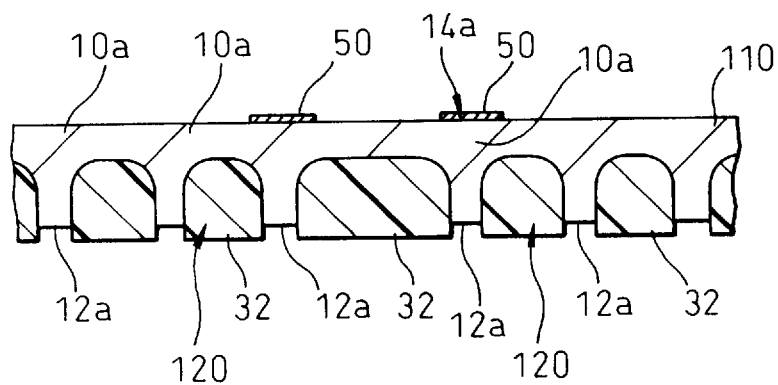
Figure 30:
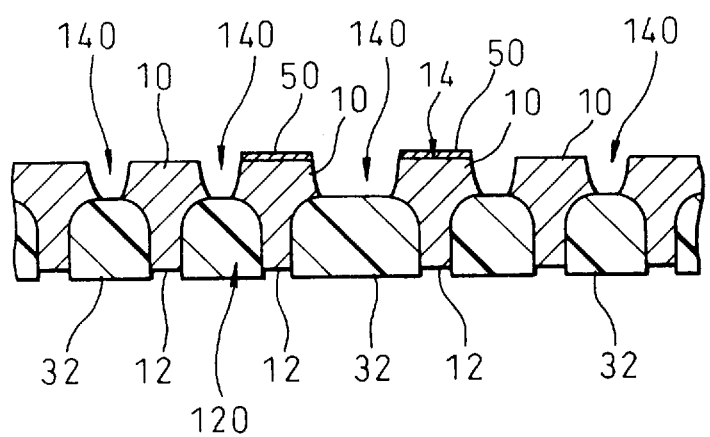

Now, a method of fabricating the fourth semiconductor device package shown in FIG. 6 according to a preferred embodiment will be explained. FIGS. 26 to 30 are diagrams for explaining the steps of fabricating the fourth semiconductor device package according to the present invention. As shown in FIG. 26, predetermined portions of the lower surface of the metal plate 110 are etched and a plurality of contour grooves 120 having a substantially inverted-U section are formed in a predetermined pattern on the lower surface of the metal plate 110. The metal plate 110 is formed with a plurality of lead-forming portions 10a juxtaposed and defined by the contour blind grooves 120. Then, as shown in FIG. 27, the terminals 14a on the upper surfaces of the lead-forming portions are deposited with a plating 50 of silver or the like for bonding. Then, as shown in FIG. 28, the lower surfaces and the side surfaces of a plurality of the lead-forming portions 10a and the inner side surfaces of the contour blind grooves 120 interposed therebetween are deposited with a continuous layer of the insulating material 32 of photosensitive polyimide resin, normal polyimide resin, epoxy resin or the like by the transfer mold process or the potting process. Then, as shown in FIG. 29, the portions of the insulating material 32 just under the terminals 12a on the lower surfaces of the lead-forming portions are removed. The terminals 12a on the lower surfaces of the lead-forming portions are thus exposed outside the insulating material 32. Then, as shown in FIG. 30, predetermined portions of the upper surface of the metal plate 110 are etched, and contour grooves 140 having a substantially U-shaped section are formed in the upper surface portions of the metal plate 110 just above the contour blind grooves 120. The contour grooves 140 separate a plurality of the lead-forming portions 10a from each other. The leads 10 are formed horizontally at predetermined spatial intervals. At the same time, the insulating material 32 is exposed between the contour grooves 140. Also, a plurality of the leads 10 are integrally coupled to each other through the Insulating material 32. At the same time, the leads 10 are insulated electrically from each other by the insulating material 32 interposed therebetween.

Figure 31:
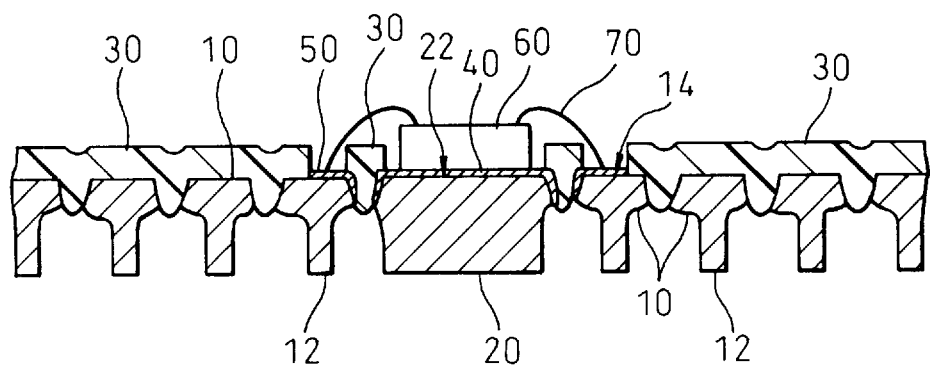
FIGS. 31 and 32 are diagrams for explaining a method of fabricating the first semiconductor device according to the invention.
Figure 32:
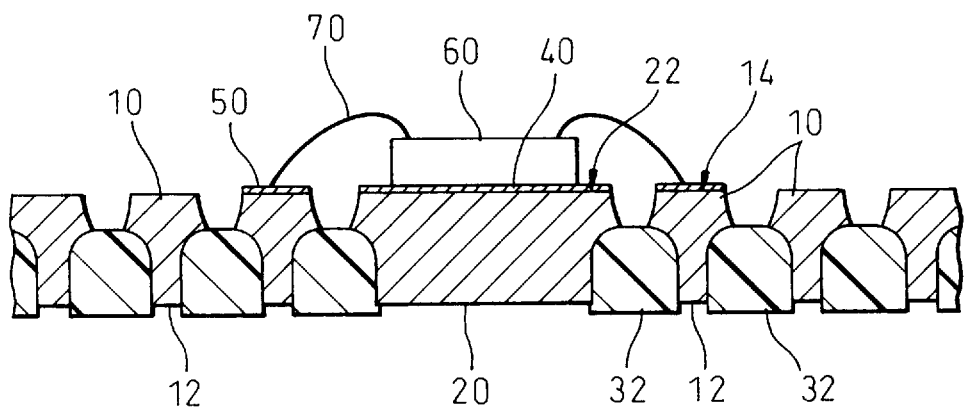

An explanation will be made about a method of fabricating the first semiconductor device according to a preferred embodiment of the present invention using the first or third semiconductor device package (FIGS. 1 and 4). FIGS. 31 to 32 are diagrams for explaining the steps in a method of fabricating the first semiconductor device according to a preferred embodiment of the present invention. In the method of fabricating the first semiconductor device, as shown in FIG. 31 or 32, a semiconductor chip 60 is bonded on the upper surface 22 deposited with a bonding plating 40 for the first or third semiconductor device package. The semiconductor chip 60 is mounted on the stage 20. The electrodes of the semiconductor chip 60 and the terminals 14 on the upper surfaces of the leads deposited with a bonding plating 50 are electrically connected to each other through wires 70 using a wire bonding device or the like.

Then, as shown in FIG. 7 or 8, the upper surface of the stage 20 and the upper surfaces of the leads 10 are deposited with a layer of a sealing insulating material 80 of epoxy resin, polyimide resin or the like thereby to seal the semiconductor chip 60 and the wires 70 in the sealing insulating material 80. Then, the terminals 12 of the lower surfaces of the leads and the lower surface of the stage 20 are formed with soldering bumps 90 and 100, respectively. In the process, the lower surface of the stage 20 and the protruded terminals 12 formed on the lower surfaces of the leads 10 are immersed in a soldering bath, so that the terminals 12 on the lower surfaces of the leads and the lower surface of the stage 20 are formed with the soldering bumps 90, 100 respectively (FIG. 7).

Also, the terminals 12 on the lower surfaces of the leads 10 exposed between the insulating material 32 and the lower surface of the stage 20 are soldered with a soldering ball (not shown) to thereby form the soldering bumps 90, 100 on the terminals 12 on the lower surfaces of the leads and the lower surface of the stage 20, respectively.

Figure 33:
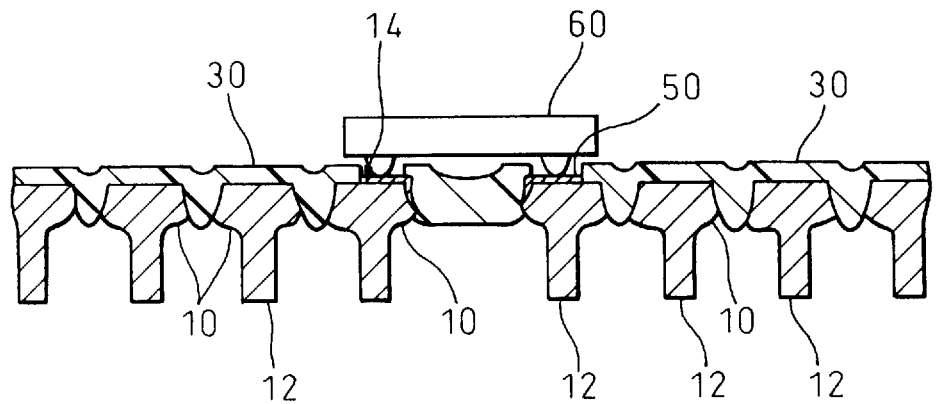
FIGS. 33 and 34 are diagrams for explaining a method of fabricating the second semiconductor device according to the invention.
Figure 34:
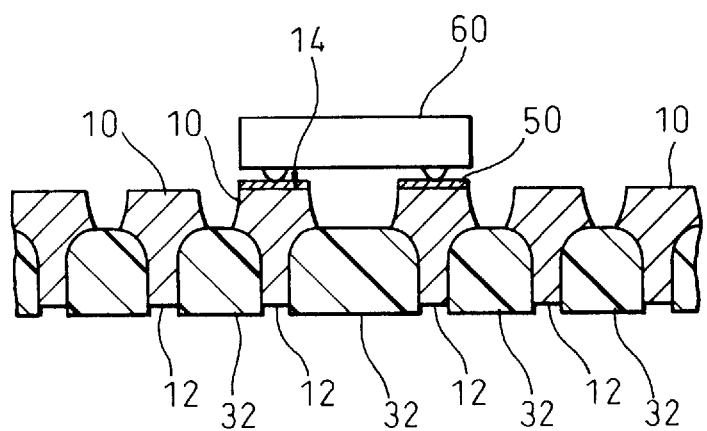

An explanation will be made about a method of fabricating the second semiconductor device according to a preferred embodiment of the invention using the second or fourth semiconductor device package (FIGS. 3 and 6) described above. FIGS. 33 and 34 are diagrams for explaining the steps in a method of fabricating the second semiconductor device according a preferred embodiment of the present invention.

In this method of fabricating the second semiconductor device, as shown in FIG. 33 or 34, a semiconductor chip 60 is arranged above the leads 10 of the second or fourth semiconductor device package. The electrodes of the semiconductor chip 60 are electrically connected by flip chip bonding to the terminals 14 on the upper surfaces of the leads just under the same electrode. Then, as shown in FIGS. 9 and 10, the upper surfaces of the leads 10 are deposited with a layer of a sealing insulating material 80 of epoxy resin, polyimide resin or the like thereby to seal the semiconductor chip 60 in the sealing insulating material 80. Then, the terminals 12 on the lower surfaces of the leads are formed with soldering bumps 90.

A plurality of the leads 10 with or without the stage 20 may alternatively be arranged in steps instead of being horizontally juxtaposed, and a plurality of the lead-forming portions 10a and/or the stage-forming portion 20a may alternatively be formed in steps instead of being horizontally juxtaposed. Also in such a case, there is provided a semiconductor device having a similar function to the semiconductor device package or the semiconductor device described above.

Alternatively, the leads 10 or the lead-forming portions 10a can be formed of a material having a superior bonding property without depositing the bonding plating layer 50 on the terminals 14a on the upper surfaces of the lead-forming portions or the terminals 14 on the upper surfaces of the leads, so that the electrodes of the semiconductor chip 60 may be bonded directly or through the wires 70 or the like to the exposed material of the terminals 14 on the upper surfaces of the leads. Alternatively or additionally, the semiconductor chip 60 can be coupled to the upper surface 22 of the stage using an adhesive or the like without depositing the upper surface 22a of the stage-forming portion or the upper surface 22 of the stage with a bonding plating layer 40.

Further, in order to reduce the consumption of the sealing insulating material 80 of the above-mentioned semiconductor device, only the upper surfaces of the leads and the upper surface of the stage 20 in the neighborhood of the semiconductor chip 60 and/or the upper surfaces of the leads 10 in the neighborhood of the wires 70 can be deposited with the sealing insulating material 80 thereby to seal the semiconductor chip 60 and/or the wires 70 in the sealing insulating material 80. In such a case, the semiconductor chip 60 and the wires 70 can be protected from dust or dirt and humidity.

Also, in the above-mentioned method of fabricating a semiconductor device package, a continuous layer of the insulating materials 30, 32 is deposited on the upper surfaces and the side surfaces of a plurality of the lead-forming portions 10a except for the terminals 14a on the upper surfaces of the lead-forming portions or the upper surfaces and the side surfaces of the lead-forming portions 10a, and/or the side surface of the stage-forming portion 20a and the inner side surfaces of the contour blind grooves 120 interposed therebetween. After that, the terminals 14a on the upper surfaces of the lead-forming portions and/or the upper surface of the stage-forming portion 20a can be deposited with the bonding plating layers 50, 40. In such a case, a semiconductor device package having a similar function to the first, second, third or fourth semiconductor device package can be provided.

Further, in the above-mentioned semiconductor device, the soldering bumps 90 are not required on the terminals 12 on the lower surfaces of the leads nor the soldering bump 100 on the lower surface of the stage 20. Instead, the terminals 12 and the stage 20 can be connected by soldering to the terminals of the electronic circuits and the stage coupling formed on the board surface by using the solder paste coated on the surfaces of the terminals of the electronic circuits and the stage coupling.

Furthermore, in forming the soldering bumps 90 on the terminals 12 on the lower surfaces of the leads or in forming the soldering bump 100 on the lower surface of the stage 20, the terminals 12 on the lower surfaces of the leads or the lower surface of the stage 20 is plated with tin or the like thereby to improve the solderability of such surfaces. These surfaces thereby can be formed with the soldering bumps 90, 100 accurately.

Figure 35:
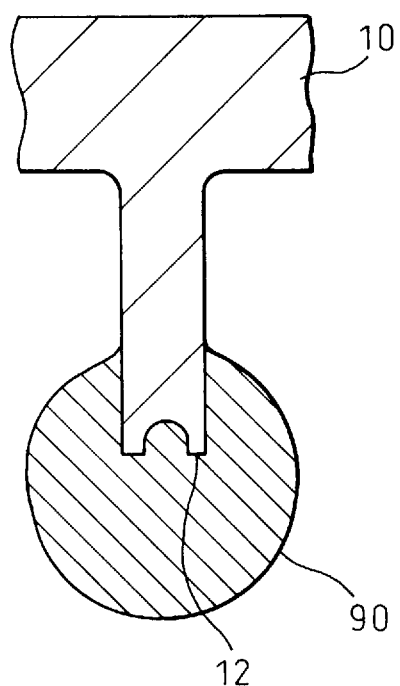
FIG. 35 is an enlarged sectional view of a terminal formed on the lower surface of a lead.

Also, in the above-mentioned first or second semiconductor device package, the forward ends of the terminals 12 protruding from the lower surfaces of the leads 10 can be formed substantially in inverted-Y shape as shown in FIG. 35. Then, the soldering bumps 90 can be formed accurately on the terminals 12 and the terminals 12 can be accurately connected by soldering to the terminals of the electronic circuits formed on the board surface.

Figure 36:
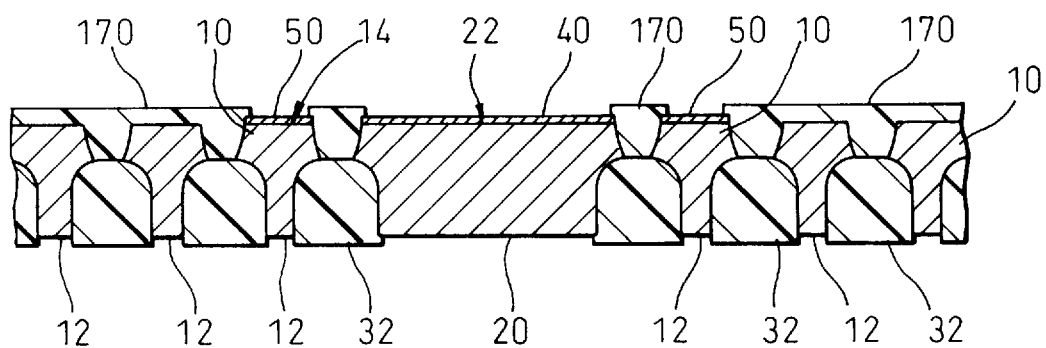
FIG. 36 is a sectional view of the third semiconductor device package according to the invention.
Figure 37:
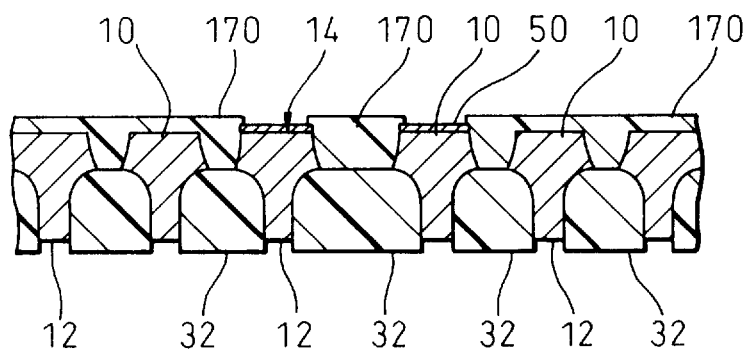
FIG. 37 is a sectional view of the fourth semiconductor device package according to the invention.

What is more, in the third or fourth semiconductor device package, as shown in FIGS. 36 to 37, the upper surfaces and the side surfaces of the leads 10 except for the terminals 14 on the upper surfaces of the leads and/or the side surface of the stage 20 can be deposited with a continuous layer of a reinforcing insulating material 170 of epoxy resin, polyimide resin or the like. A plurality of the leads 10 can thus be coupled firmly to each other and/or the leads 10 and the stage 20 can be coupled firmly to each other through the reinforcing insulating material 170 as well as through the insulating material 32.

Figure 38:
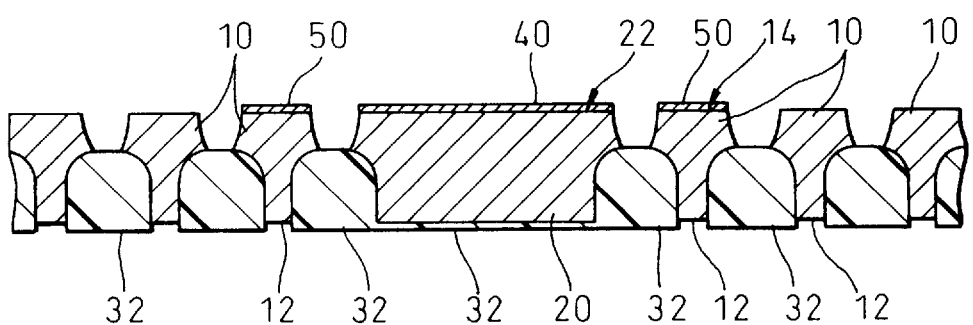
FIG. 38 is a sectional view of the fifth semiconductor device package according to the invention.

In addition, in the third semiconductor device package described above, as shown in FIG. 38, the lower surface of the stage 20 as well as the side surfaces of the stage 20 can be deposited with a continuous layer of the insulating material 32. The stage 20 and the leads 10 thus can be securely coupled integrally to each other.

Figure 39:
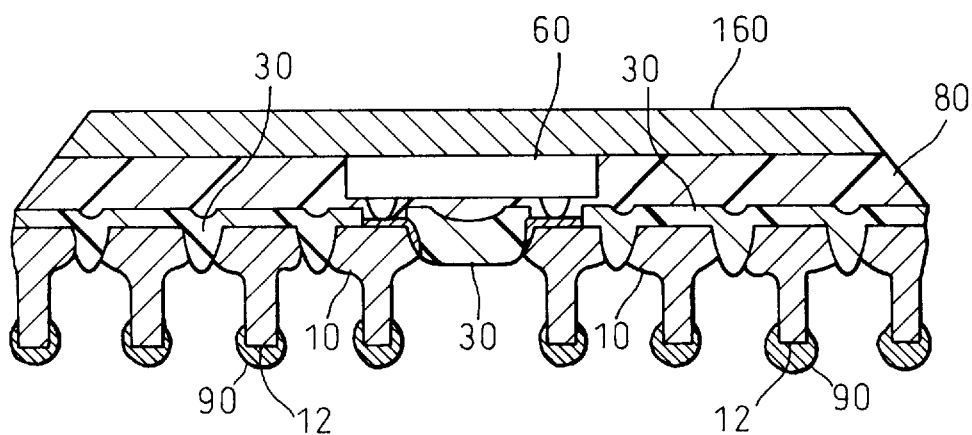
FIGS. 39 and 40 are sectional views of the second semiconductor device according to the invention.
Figure 40:
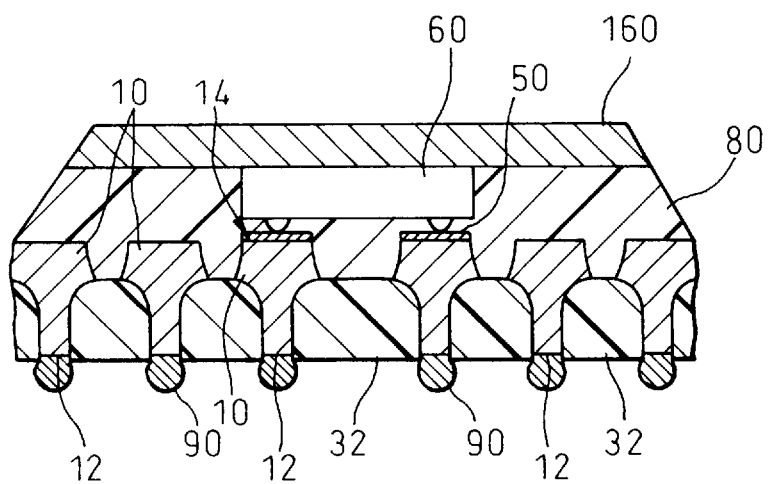

Furthermore, in the second semiconductor device described above, as shown in FIGS. 39 and 40, the reverse side of the semiconductor chip 60 is exposed out of the sealing insulating material 80 and a heat spreader 160 of a metal having a high heat-dissipation capability can be deposited on the reverse side of the chip. The heat generated from the semiconductor chip 60 thus can be dissipated efficiently out of the semiconductor device through the heat spreader 160.

Further, in the method of fabricating a semiconductor device package described above, the metal plate 110 is composed of a long metal band for forming a lead frame, which has formed therein sets of a plurality of lead-forming portions 10a and/or a stage-forming portion 20a juxtaposed and defined by contour blind grooves 120 at predetermined spatial intervals for forming the semiconductor device package. A plurality of semiconductor device packages thus can be easily formed at one time using the particular metal band.

Figure 41:
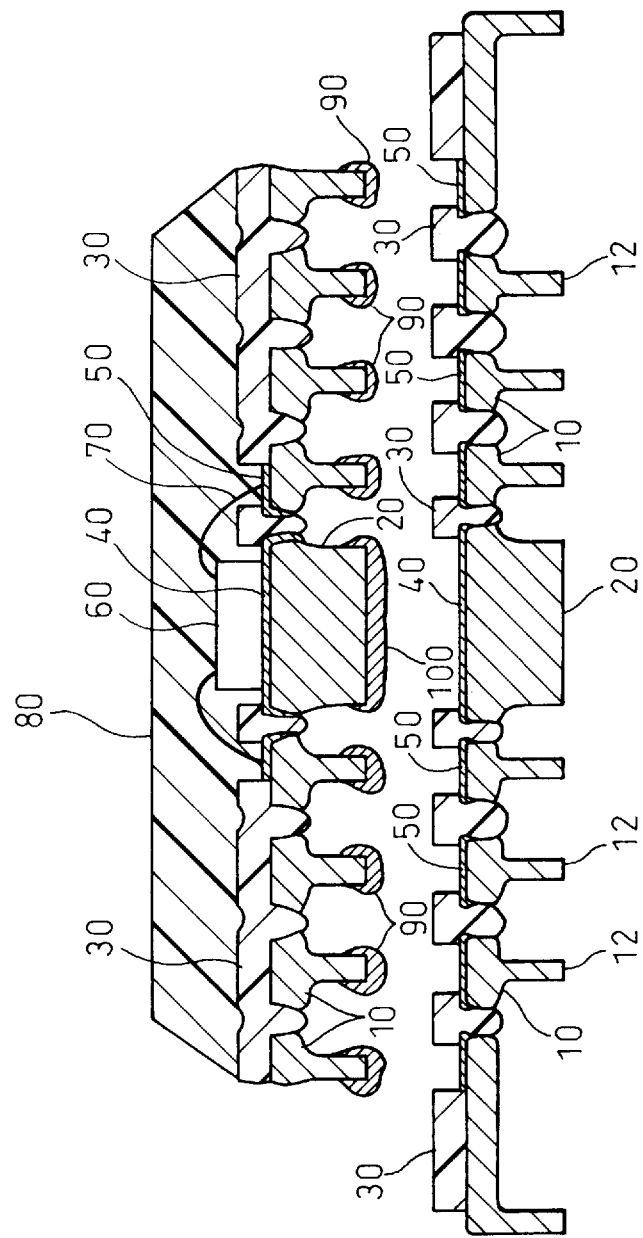
FIG. 41 is a diagram for explaining the first semiconductor device package according to the invention used as a motherboard.

Also, the semiconductor device package described above, as shown in FIG. 41, can be used also as a motherboard for mounting the first or second semiconductor device or one or a plurality of other electronic parts.

Figure 42:
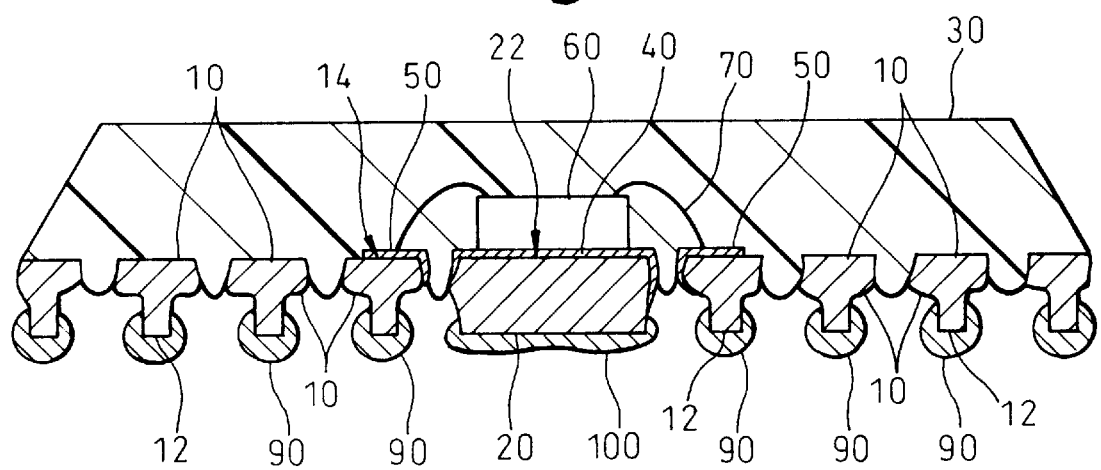
FIGS. 42 and 43 are sectional views of the third semiconductor device according to the invention.
Figure 43:
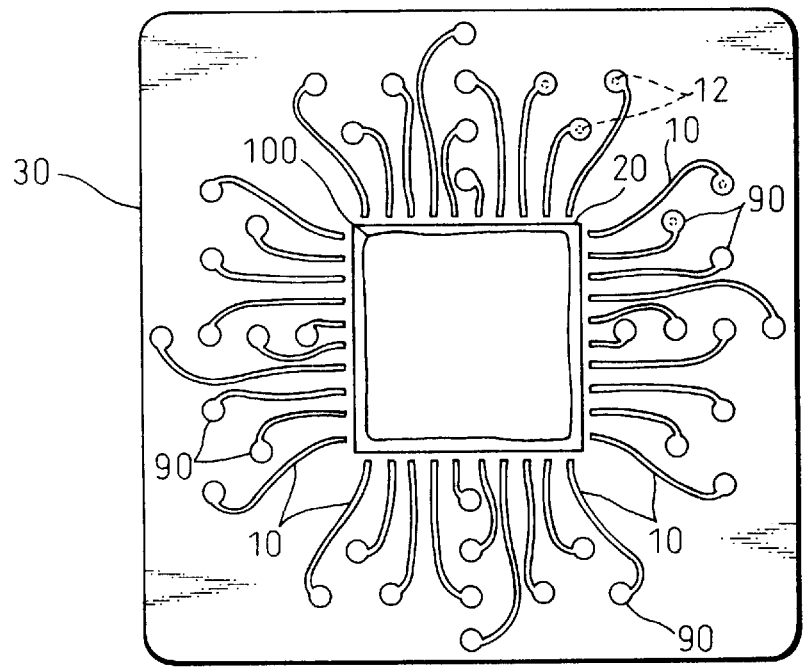

FIGS. 42 and 43 show the third semiconductor device according to a preferred embodiment of the invention, in which FIG. 42 is a sectional view and FIG. 43 is a bottom view thereof. In FIGS. 42 and 43, reference numeral 10 designates a plurality of thin band-shaped leads in juxtaposition. Numeral 20 designates a rectangular stage arranged at substantially the central portion of the arrangement of the leads 10. A plurality of the leads 10 and the stage 20 are arranged horizontally at predetermined spatial intervals. A plurality of the leads 10 and stage 20 are formed of a metal plate composed of copper, a copper alloy, an iron-nickel alloy or an iron-nickel-cobalt alloy.

A predetermined portion of the lower surface of each of the leads 10 is formed with a protruded terminal 12 for connecting by soldering a corresponding terminal of the electronic circuits formed on the board surface. A plurality of the terminals 12 thus protruded from the lower surfaces of a plurality of the leads 10, as shown in FIG. 2, are arranged in a grid or the like form similar to the arrangement of the terminals of the electronic circuits formed on the board surface. The terminals 14 on the upper surfaces of the leads are deposited with a plating layer 50 of silver or the like for bonding. In similar fashion, the upper surface 22 of the stage is deposited with a plating layer 40 of silver or the like for bonding. The upper surface 22 of the stage deposited with the bonding plating layer 40 is bonded with a semiconductor chip 60. The stage 20 thus has mounted thereon the semiconductor chip 60. The electrodes of the semiconductor chip 60 and the terminals 14 on the upper surfaces of the leads deposited with the bonding plating layer 50 are electrically connected to each other through wires 70. The upper surfaces and the side surfaces of a plurality of the leads 10 arranged at predetermined spatial intervals and the upper surface and the side surface of the stage 20 are deposited with a continuous layer of the insulating material 30 of epoxy resin, polyimide resin or the like. A plurality of the leads 10 and the stage 20 are integrally coupled to each other through the insulating material 30. At the same time, the semiconductor chip 60 and the wires 70 are sealed in the insulating material 30. The semiconductor chip 60 and the wires 70 are protected from intrusion of dust or dirt and from humidity. The insulating material 30 is interposed between a plurality of the leads 10 or between the leads 10 and the stage 20 thereby to electrically insulate the leads 10 from each other and the leads 10 and the stage 20 from each other. The terminals 12 protruded form the lower surfaces of the leads 10 are exposed out of the insulating material 10. The stage 20 is formed thicker by the length of the protrusion of the terminals 12 formed on the lower surfaces of the leads 10. In this way, the stage 20 is formed in a manner with the lower surface thereof connectable by soldering to a stage-coupling metal formed on the surface of the board. The terminals 12 on the lower surfaces of the leads and the lower surface of the stage 20 are formed with soldering bumps 90, 100, respectively.

In the semiconductor device shown in FIGS. 42 and 43, the terminals 12 on the lower surfaces of the leads can be connected by soldering to the terminals of the electronic circuits formed on the board surface using the soldering bumps 90 formed on the terminals 12 on the lower surfaces of the leads. In the process, the lower surface of the stage 20 can be connected by soldering to a stage-coupling metal formed on the board surface using the soldering bump 100 formed on the lower surface of the stage 20. The heat generated in the semiconductor chip 60 can thus be efficiently dissipated to the board by way of the stage 20.

Now, a method of fabricating the third semiconductor device shown in FIGS. 42 and 43 according to a preferred embodiment will be explained below. FIGS. 44 to 47 are diagrams for explaining the steps in a method of fabricating a semiconductor device according to a preferred embodiment.

As shown in FIGS. 44 to 47, a plurality of predetermined portions on the upper surface of the metal plate 110 composed of copper, a copper alloy, an iron-nickel alloy, an iron-nickel-cobalt alloy or the like are etched thereby to form contour blind grooves 20 having a substantially U-shaped section in a predetermined pattern on the upper surface of the metal plate 110. The metal plate 110 is formed with a plurality of lead-forming portions 10a and a stage-forming portion 20a juxtaposed and defined by the contour blind grooves 120. Specifically, the upper surface of the metal plate 110 is formed with a resist layer 130 in a predetermined pattern (FIG. 11). The remaining lower surface and side surface portions of the metal plate 110 are formed also with the resist layer 130. The metal plate 110 formed with these resist layers 130 is immersed in an etching bath thereby to etch the predetermined upper surface portions of the metal plate 110 exposed between the resist layers 130. The upper surface of the metal plate 110 thus is formed with a plurality of contour blind grooves 120 in a predetermined pattern. After that, the resist layers 130 are separated from the surface of the metal plate 110. Then, as shown in FIG. 13, the terminals 14a on the upper surfaces of the lead-forming portions are deposited with a plating layer 50 of silver or the like for bonding. In similar fashion, the upper surface 22a of the stage-forming portion is covered with a plating layer 40 of silver or the like for bonding.

Specifically, the upper surface portions of the metal plate 110 except for the terminals 14a on the upper surfaces of the lead-forming portions, the upper surface 22a of the stage-forming portion and the inner side surfaces of the contour blind grooves 120 interposed therebetween are covered with a rubber mask (not shown). Then, continuous plating layers 40, 50 of silver or the like are deposited on the terminals 14a on the upper surfaces of the lead-forming portions, the upper surface 22a of the stage-forming portion and the inner side surfaces of the contour blind grooves 120 interposed therebetween.

Figure 44:
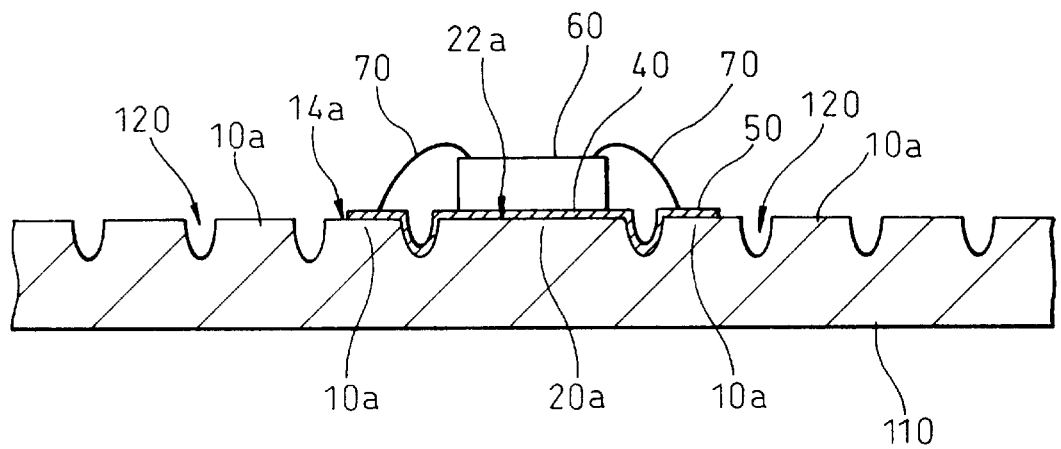
FIGS. 44 to 48 are diagrams for explaining a method of fabricating the third semiconductor device according to the invention.

Then, as shown in FIG. 44, the upper surface 22a of the stage-forming portion deposited with the bonding plating layer 40 is bonded with a semiconductor chip 60. The semiconductor chip 60 is mounted on the stage-forming portion 20a.

The electrodes of the semiconductor chip 60 are electrically connected through wires 70 to the terminals 14a on the upper surfaces of the lead-forming portions deposited with the bonding plating layer 50 by the use of a wire bonding device or the like.

Figure 45:
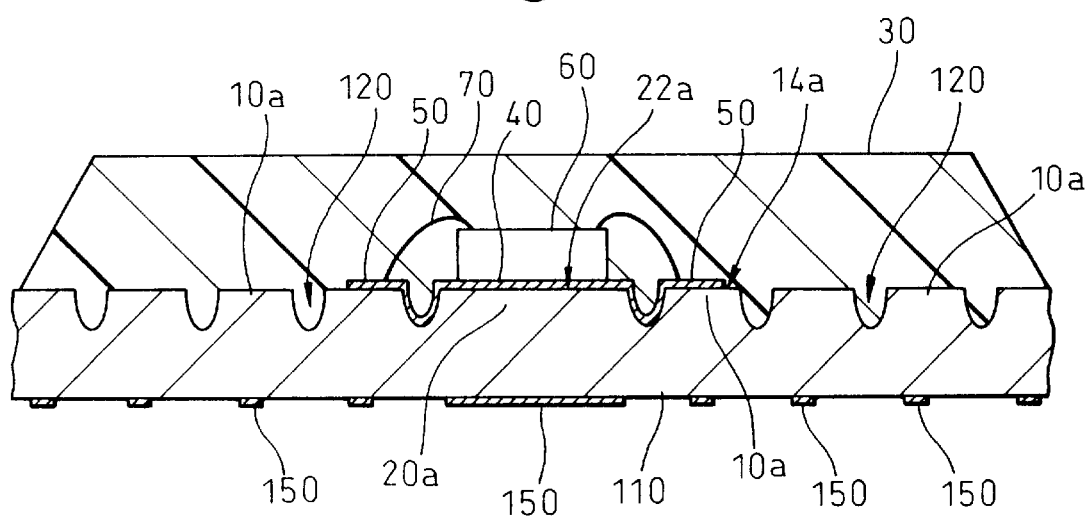

Then, as shown in FIG. 45, the upper surfaces and the side surfaces of a plurality of the lead-forming portions 10a, the upper surface and the side surfaces of the stage-forming portion 20a and the inner side surfaces of the contour blind grooves 120 interposed therebetween are deposited with a continuous layer of an insulating material 30 of epoxy resin, polyimide resin or the like by the transfer mold method or by the potting method. A plurality of the lead-forming portions 10a and the stage-forming portion 20a are integrally coupled to each other through the insulating material 30. At the same time, the semiconductor chip 60 and the wires 70 are sealed in the insulating material 30. The semiconductor chip 60 and the wires 70 thus are protected from dust or dirt and humidity.

Figure 46:
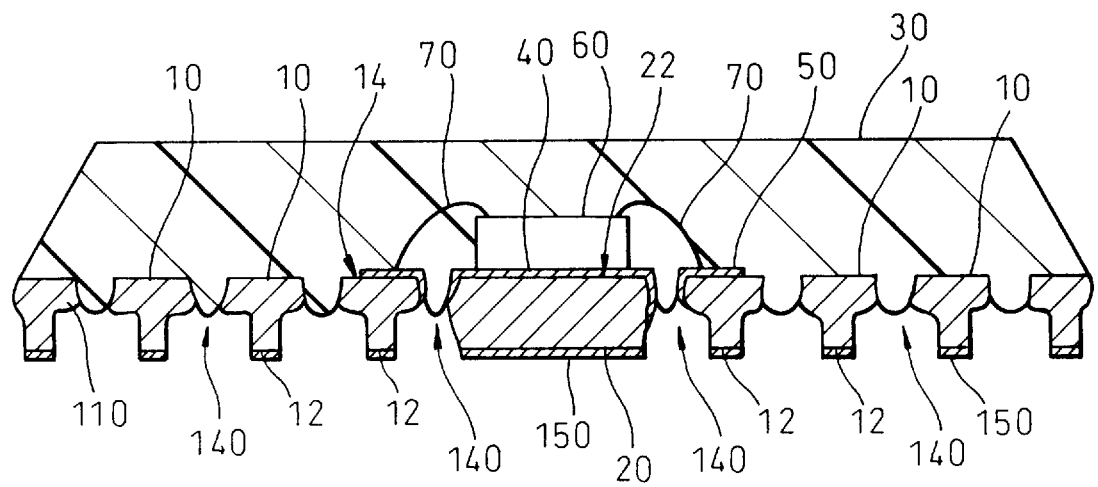

Then, as shown in FIG. 46, a plurality of predetermined lower surface portions of the metal plate 110 are etched, so that the lower surface portions of the metal plate 110 just under the contour blind grooves 120 are formed with contour grooves 140 having a substantially U-shaped section. The contour grooves 140 separate a plurality of the lead-forming portions 10a from each other and the lead-forming portions 10a and the stage-forming portions 20 from each other. The leads 10 and the stage 20 are formed horizontally at predetermined spatial intervals. At the same time, the insulating material 30 is exposed between the contour grooves 140, so that a plurality of predetermined lower surface portions of the leads 10 are formed with protruded terminals 12.

Figure 47:
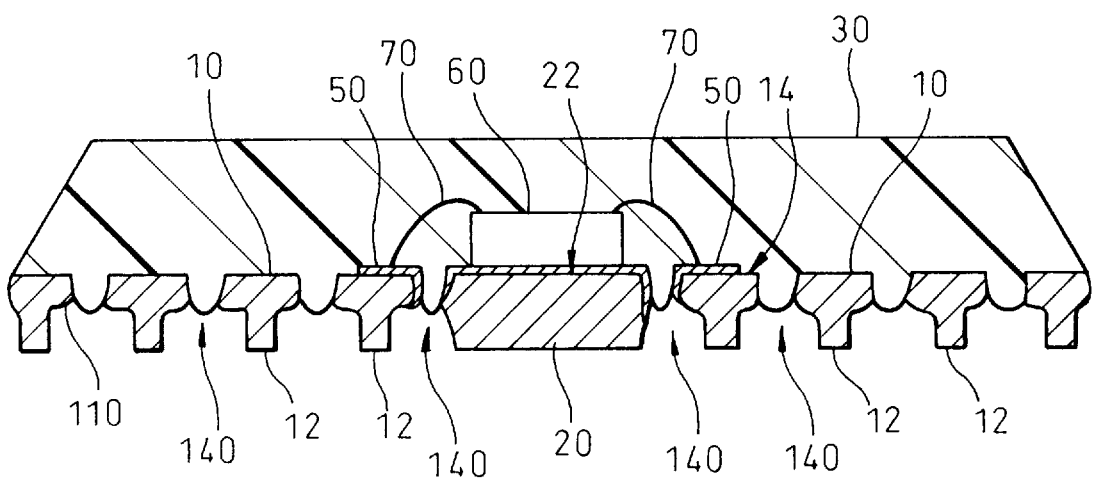

Specifically, as shown in FIG. 45, the lower surface of the metal plate 110 is formed with a resist layer 150 in a predetermined pattern. Also, the side surfaces of the metal plate 110 are formed with a resist layer (not shown). The metal plate 110 thus formed with the resist layers 150 is immersed in the etching bath thereby to etch the lower surface portions of the metal plate 110 exposed between the resist layers 150. The lower surface portions of the metal plate 110 just under the contour blind grooves 120 are formed with a plurality of the contour grooves 140. After that, as shown in FIG. 47, the resist layer 150 is separated from the surface of the metal plate 110.

Figure 48:
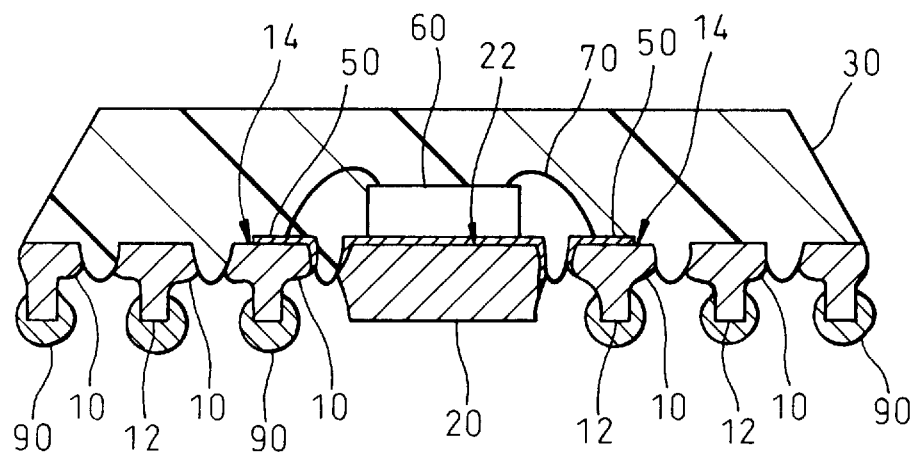

Then, the terminals 12 protruding from the lower surfaces of the leads 10 and the lower surface of the stage 20 are immersed in a soldering bath. As shown in FIG. 48, the terminals 12 formed protruding from the lower surfaces of the leads 10 and the lower surface of the stage 20 are formed with soldering bumps 90, 100.

FIG. 48 shows a fourth semiconductor device according to a preferred embodiment of the invention, or in particular, a sectional view thereof.

With the fourth semiconductor device shown, the stage 20 is not juxtaposed with the leads 10 but only a plurality of the leads 10 are arranged horizontally at predetermined spatial intervals.

A plurality of predetermined lower surface portions of the leads 10 are formed with a plurality of protruded terminals 12.

A semiconductor chip 60 is arranged above the leads 10. The electrodes of the semiconductor chip 60 are electrically connected by the flip chip bonding to the terminals 14 on the upper surfaces of the leads just under the particular electrodes.

The upper surfaces and the side surfaces of a plurality of the leads 10 are deposited with a continuous layer of an insulating material 30. A plurality of the leads 10 are integrally coupled to each other through the insulating material 30. At the same time, the semiconductor chip 60 is sealed in the insulating material 30. The semiconductor chip 60 thus is protected from dust or dirt and humidity.

The other component parts are configured similarly to those of the semiconductor device shown in FIGS. 42 and 43. The semiconductor device according to this embodiment also find similar applications and have similar functions to those of the semiconductor device shown in FIGS. 42 and 43.

An explanation will be made about a method of fabricating the fourth semiconductor device, i.e., a second method of fabricating a semiconductor device according to the invention.

FIGS. 49 to 54 show a method of fabricating the fourth semiconductor device according to a preferred embodiment of the invention, or in particular the steps of fabrication thereof.

Figure 49:
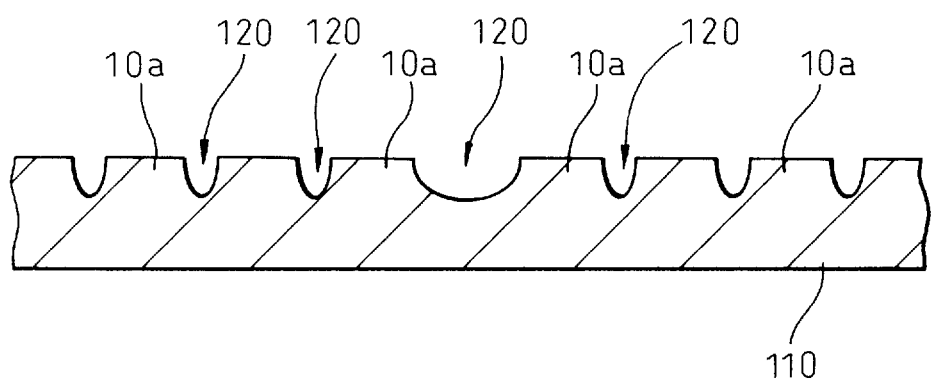
FIGS. 49 to 54 are sectional views of the fourth semiconductor device according to the invention.

As shown in FIG. 49, a plurality of predetermined portions of the upper surface of a metal plate 110 are etched, so that a plurality of contour blind grooves 120 are formed in a predetermined pattern in the upper surface of the metal plate 110. The metal plate 110 is formed with a plurality of lead-forming portions 10a in juxtaposition defined by the contour blind grooves 120.

Figure 50:
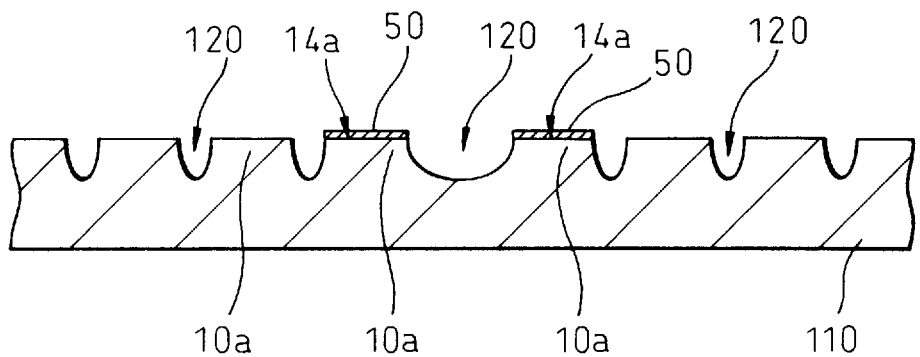

Then, as shown in FIG. 50, the terminals 14a on the upper surfaces of the lead-forming portions are deposited with a plating layer 50 of silver or the like for bonding.

Figure 51:
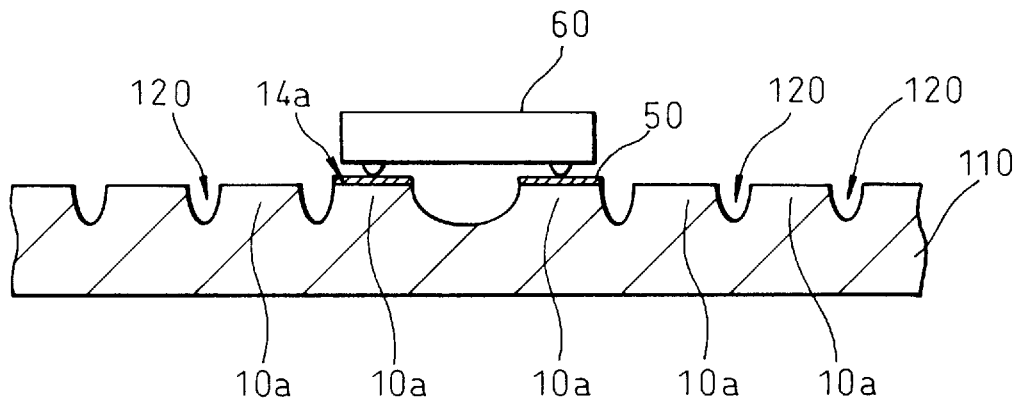

Then, as shown in FIG. 51, the semiconductor chip 60 is arranged above the lead-forming portions 10a. The electrodes of the semiconductor chip 60 are electrically connected by the flip chip bonding to the terminals 14a on the upper surfaces of the lead-forming portions Just under the same electrodes.

Figure 52:
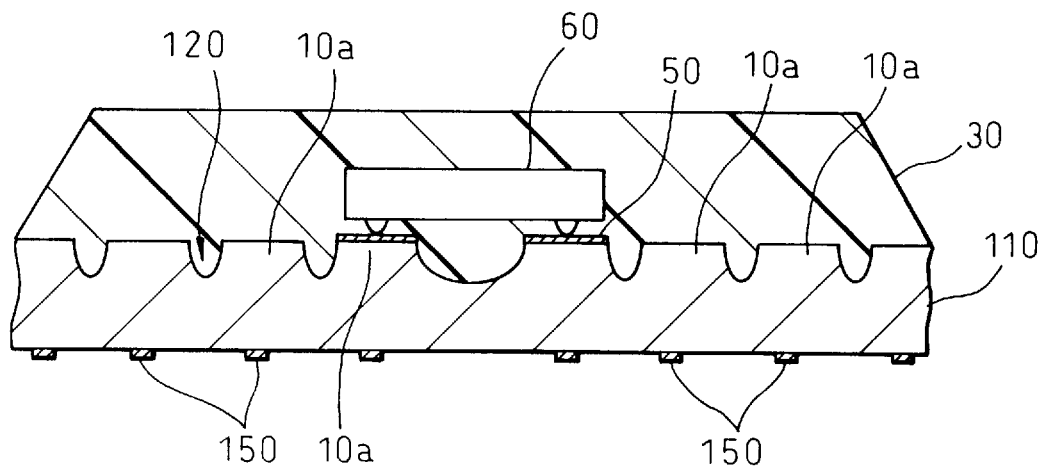

Then, as shown in FIG. 52, the upper surfaces and the side surfaces of a plurality of the lead-forming portions 10a and the inner side surfaces of the contour blind grooves 120 interposed therebetween are deposited with a continuous layer of the insulating material 30. A plurality of the lead-forming portions 10a are integrally coupled to each other through the insulating material 30. At the same time, the semiconductor chip 60 is sealed in the insulating material 30. The semiconductor chip 60 thus is protected from dust or dirt and humidity.

Figure 53:
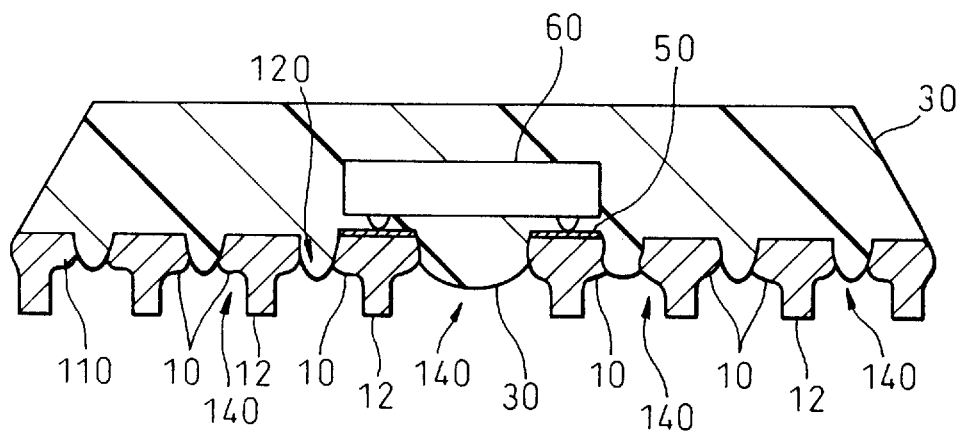

Then, as shown in FIG. 53, a plurality of predetermined portions of the lower surface of the metal plate 110 are etched, and the lower surface portions of the metal plate 110 just under the contour blind grooves 120 are formed with a plurality of contour grooves 140. The contour grooves 140 separate a plurality of the lead-forming portions 10a from each other. A plurality of the leads 10 are formed horizontally at predetermined spatial intervals. At the same time, the insulating material 30 is exposed between the contour grooves 140, and the predetermined lower surface portions of the leads 10 are formed with the protruded terminals 12, respectively.

Then, the terminals 12 protruding from the lower surfaces of the leads 10 are formed with soldering bumps 90, respectively. The second semiconductor device as shown in FIG. 10 thus is formed.

In the third or the fourth semiconductor and the third or fourth method of fabricating a semiconductor device described above, as shown in FIG. 35, the lower ends of the terminals 12 on the lower surfaces of the leads can be formed in substantially Inverted-Y shape or the area surrounding each terminal 12 on the lower surface of the corresponding lead can be widened. In this way, the terminals 12 on the lower surfaces of the leads can be accurately formed with the soldering bumps or can be accurately connected by soldering to the terminals of the electronic circuits formed on the board surface.

It is also possible to connect by soldering the terminals 12 on the lower surfaces of the leads to the terminals of the electronic circuits formed on the board surface or the lower surface of the stage 20 to a stage-coupling metal formed on the board surface by the use of the terminals of the electronic circuits formed on the board surface or the solder paste coated on the stage-coupling metal without forming the solder bumps 90 on the terminals 12 on the lower surfaces of the leads or the solder bump 100 on the lower surface of the stage 20.

Further, in forming the soldering bumps 90 on the terminals 12 on the lower surfaces of the leads or the soldering bump 100 on the lower surface of the stage 20, on the other hand, the surrounding area of each terminal 12 on the lower surface of the corresponding lead or the lower surface of the stage 20 can be plated with tin or the like thereby to improve the solderability of the particular surfaces. In this way, these surfaces can be easily and accurately formed with the soldering bumps 90 and 100.

Furthermore, the lead 10 or the lead-forming portion 10a or the wire 70 can be formed of a metal material superior in bonding properties so that the wire 70 and the electrode of the semiconductor chip 60 can be bonded directly to the material of the terminal 14a on the upper surface of the lead-forming portion or the terminal 14 on the upper surface of the lead or the semiconductor chip 60 can be bonded by use of an adhesive or the like to the upper surface 22a of the stage-forming portion or the upper surface 22 of the stage without using the bonding plating 40, 50 on the terminal 14 on the upper surface of the lead or the terminal 14a on the upper surface of the lead and/or the upper surface 22a of the stage-forming portion or the upper surface of the stage.

Also, a plurality of the leads 10 or a plurality of the lead-forming portions 10a and/or the stage 20 or the stage-forming portion 20a can be arranged in steps instead of in horizontal juxtaposition. In such a case, a semiconductor device having a similar function to the first or second semiconductor device described above can be provided or formed.

Further, with the method of fabricating the third or the fourth semiconductor device described above, a long metal band for forming a lead frame or the like can be used as the metal plate 110, in which a plurality of sets each including a plurality of lead-forming portions 10a with or without a stage-forming portion 20a are defined by the contour blind grooves 120 and juxtaposed at predetermined pitches thereby to constitute the first or second semiconductor device. A plurality of the first or second semiconductor devices can be thus formed at the same time easily using the same metal band.

Figure 54:
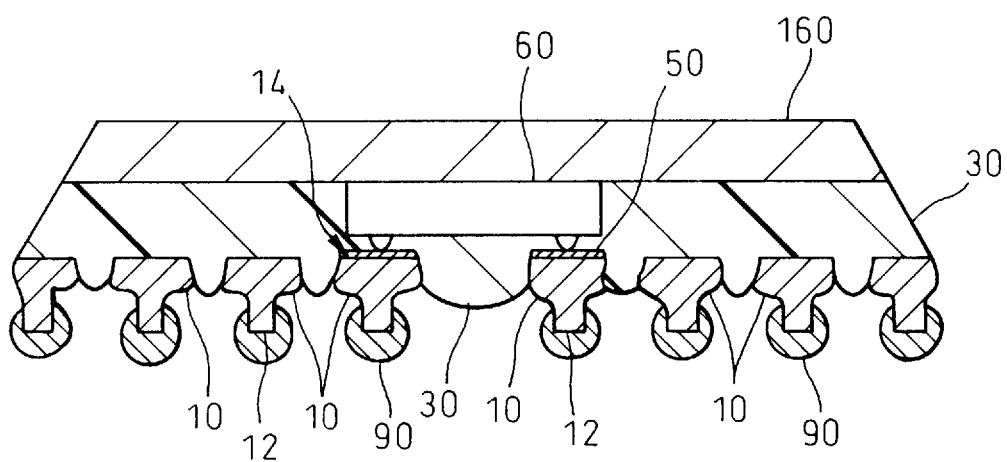

Furthermore, with the above-mentioned fourth semiconductor device, as shown in FIG. 54, the reverse side of the semiconductor chip 60 can be exposed outside the insulating material 30, and a heat spreader 169 made of a metal having a high heat-dissipation capability can be covered on the reverse side of the chip. Also, the above-mentioned method of fabricating the fourth semiconductor can comprise the step of exposing the reverse side of the semiconductor chip 60 outside the insulating material 30, and depositing a heat spreader of metal or the like having a high heat-dissipation capability on the reverse side of the chip. There is thus provided or formed a semiconductor device in which the heat generated from the semiconductor chip 60 can be efficiently dissipated out of the semiconductor device through the heat spreader 160.

It will thus be understood from the foregoing description that, according to the present invention, there is provided a semiconductor device package, a semiconductor device and a method of easily fabricating a semiconductor device of the BGA type.

What is claimed is:

1. A semiconductor device package comprising:
   a plurality of leads and a stage for mounting a semiconductor chip arranged in juxtaposition at predetermined spatial intervals;
   a protruded terminal formed at a predetermined portion on the lower surface of each of said leads; and
   an insulating material deposited in a continuous layer on the upper surfaces and the side surfaces of said plurality of leads and on the side surfaces of said stage;
   wherein:
   said plurality of leads and said protruded terminals on the lower surfaces of said leads are integrally formed from the same plate by separating a plurality of lead-forming portions of said plate into said plurality of leads and said protruded terminals on the lower surfaces of said leads;
   said plurality of leads and said stage are integrally coupled to each other through said insulating material; and
   the upper surfaces of said leads, the upper surface of said stage and said protruded terminals on the lower surfaces of said leads are exposed out of said insulating material.

2. A semiconductor device package according to claim 1, wherein the upper surfaces of said leads and the upper surface of said stage are plated for bonding.

3. A semiconductor device comprising a package according to claim 1 and a semiconductor chip bonded on the upper surface of the stage, the electrodes of said chip being electrically connected to the terminals on the upper surfaces of said leads, and the upper surface of said stage and the upper surfaces of said leads being deposited with a sealing insulating material thereby to seal said semiconductor chip in said sealing material.

4. A semiconductor device according to claim 3, wherein at least one of said protruded terminals on the lower surfaces of said leads and the lower surface of said stage is formed with a soldering bump.

5. A semiconductor device according to claim 4, wherein the upper surface of the semiconductor chip is exposed outside said sealing insulating material, and a heat spreader is placed on the upper surface of said semiconductor chip.

6. A semiconductor device package comprising:
- a plurality of leads arranged in juxtaposition at predetermined spatial intervals;
- a protruded terminal formed at a predetermined portion of the lower surface of each of said leads; and
- an insulating material deposited in a continuous layer on the upper surfaces and the side surfaces of said leads;

wherein:
- said plurality of leads and said protruded terminals on the lower surfaces of said leads are integrally formed from the same plate by separating a plurality of lead-forming portions of said plate into said plurality of leads and said protruded terminals on the lower surfaces of said leads;
- said plurality of leads are integrally coupled to each other through said insulating material; and
- the upper surfaces of said leads and said protruded terminals are exposed out of said insulating material.

7. A semiconductor device package according to claim 6, wherein the upper surfaces of said leads are plated for bonding.

8. A semiconductor device comprising a package according to claim 6, and a semiconductor chip arranged above said leads, the electrodes of said chip being electrically connected to the terminals on the upper surfaces of said leads, and the upper surfaces of said leads being deposited with a sealing insulating material thereby to seal said semiconductor chip in said sealing insulating material.

9. A semiconductor device according to claim 8, wherein the terminals on the lower surfaces of said leads are each formed with a soldering bump.

10. A semiconductor device according to claim 9, wherein the upper surface of said semiconductor chip is exposed out of said sealing insulating material, and the upper surface of said semiconductor chip holds a heat spreader.

11. A semiconductor device according to claim 3, wherein the terminals on the lower surfaces of said leads and the lower surface of said stage are each formed with a soldering bump.

12. A semiconductor device according to claim 11, wherein the upper surface of the semiconductor chip is exposed outside said sealing insulating material, and the upper surface of said semiconductor chip is deposited with a heat spreader.

13. A semiconductor device according to claim 8, wherein the terminals on the lower surfaces of said leads are each formed with a soldering bump.

14. A semiconductor device according to claim 13, wherein the upper surface of the semiconductor chip is exposed outside said sealing insulating material, and the upper surface of said semiconductor chip holds a heat spreader.

15. A semiconductor device comprising:
- a plurality of leads and a stage for mounting a semiconductor chip arranged in juxtaposition at predetermined spatial intervals;
- a semiconductor chip having electrodes and arranged above said stage;
- terminals formed on the upper surfaces of said leads;
- a protruded terminal formed at a predetermined portion on the lower surface of each of said leads; and
- means for electrically connecting the electrodes of said semiconductor chip to the terminals on the upper surfaces of said leads; and
- an insulating material deposited in a continuous layer on the upper surfaces and the side surfaces of said plurality of leads, on the side surfaces of said stage, and on the upper surface of said semiconductor chip;

wherein:
- said plurality of leads and said protruded terminals on the lower surfaces of said leads are integrally formed from the same plate by separating a plurality of lead-forming portions of said plate into said plurality of leads and said protruded terminals on the lower surfaces of said leads;
- said insulating material maintains said plurality of leads said protruded terminals on the lower surfaces of said leads, and said stage integrally coupled to each other and seals said semiconductor chip therein over said terminals on the upper surfaces of said plurality of leads and said stage; and
- said protruded terminals on the lower surfaces of said leads are exposed outside said insulating material.

16. A semiconductor device according to claim 15, wherein the terminals on the upper surfaces of said leads and the upper surface of said stage is plated for bonding.

17. A semiconductor device according to claim 15, wherein a soldering bump is formed on at least one of said protruded terminals formed on the lower surface of each of said leads and the lower surface of said stage.

18. A semiconductor device comprising:
- a plurality of leads arranged in juxtaposition at predetermined spatial intervals;
- terminals formed on the upper surfaces of said leads;
- a protruded terminal formed at a predetermined portion of the lower surface of each of said leads;
- a semiconductor chip having electrodes and arranged above said leads;
- means for electrically connecting the electrodes of said semiconductor chip to said terminals on the upper surfaces of said leads; and
- an insulating material deposited in a continuous layer on the upper surfaces and the side surfaces of said leads;

wherein:
- said plurality of leads and said protruded terminals on the lower surfaces of said leads are integrally formed from the same plate by separating a plurality of lead-forming portions of said plate into said plurality of leads and said protruded terminals on the lower surfaces of said leads;
- said insulating material maintains said plurality of leads and said protruded terminals on the lower surfaces of said leads integrally coupled to each other and seals said semiconductor chip therein over said terminals on the upper surfaces of said leads; and
- said protruded terminals on the lower surfaces of said leads are exposed outside said insulating material.

19. A semiconductor device according to claim 18, wherein the terminals on the upper surfaces of said leads are plated for bonding.

20. A semiconductor device according to claim 18, wherein a soldering bump is formed on the protruded terminal formed on the lower surface of each of said leads.

21. A semiconductor device according to claim 18, wherein the upper surface of said semiconductor chip is exposed outside said insulating material, and a heat spreader is placed on the upper surface of said semiconductor chip.

22. A semiconductor device package according to claim 1, wherein:
- said plate is a single metal plate having upper and lower surfaces;

said plurality of leads and said protruded terminals on the lower surfaces of said leads are formed by etching the upper and lower surfaces of said plate to separate said plurality of lead-forming portions of said plate into said plurality of leads and protruded terminals;

said stage is formed by etching the upper surface of said plate to separate a stage-forming portion of said plate into said stage; and said insulating material is deposited on the etched upper surface of said plate before etching of the lower surface of said plate such that said insulating material maintains said plurality of leads, said protruded terminals on the lower surfaces of said leads, and said stage together during and after etching of said plate.

23. A semiconductor device package according to claim 6, wherein:

said plate is a single metal plate having upper and lower surfaces;

said plurality of leads and said protruded terminals on the lower surfaces of said leads are formed by etching the upper and lower surfaces of said plate to separate said plurality of lead-forming portions of said plate into said plurality of leads and protruded terminals; and said insulating material is deposited on the etched upper surface of said plate before etching of the lower surface of said plate such that said insulating material maintains said plurality of leads and said protruded terminals on the lower surfaces of said leads together during and after etching of said plate.

24. A semiconductor device according to claim 15, wherein:

said plate is a single metal plate having upper and lower surfaces;

said plurality of leads and said protruded terminals on the lower surfaces of said leads are formed by etching the upper and lower surfaces of said plate to separate said plurality of lead-forming portions of said plate into said plurality of leads and protruded terminals;

said stage is formed by etching the upper surface of said plate to separate a stage-forming portion of said plate into said stage; and said insulating material is deposited on the etched upper surface of said plate before etching of the lower surface of said plate such that said insulating material maintains said plurality of leads, said protruded terminals on the lower surfaces of said leads, and said stage together during and after etching of said plate.

25. A semiconductor device according to claim 18, wherein:

said plate is a single metal plate having upper and lower surfaces;

said plurality of leads and said protruded terminals on the lower surfaces of said leads are formed by etching the upper and lower surfaces of said plate to separate said plurality of lead-forming portions of said plate into said plurality of leads and protruded terminals; and said insulating material is deposited on the upper surface of said plate before etching of the lower surface of said plate such that said insulating material maintains said plurality of leads and said protruded terminals on the lower surfaces of said leads together during and after etching of said plate.

* * * * *

UNITED STATES PATENT AND TRADEMARK OFFICE
CERTIFICATE OF CORRECTION

PATENT NO.    : 5,847,458
DATED         : December 8, 1998
INVENTOR(S)   : Nakamura, et. al.

It is certified that error appears in the above-identified patent and that said Letters Patent is hereby corrected as shown below:

Title page, item [54] and col. 1, line 2, in the title, change "HEAD" to -- LEADS--.

Signed and Sealed this

Ninth Day of March, 1999

Attest:

Attesting Officer

Q. TODD DICKINSON

Acting Commissioner of Patents and Trademarks